United States Patent
Baby et al.

(10) Patent No.: US 12,005,677 B2
(45) Date of Patent: Jun. 11, 2024

(54) ARTICLE COMPRISING PUNCTURE RESISTANT LAMINATE WITH ULTRA-THIN GLASS LAYER

(71) Applicant: CORNING INCORPORATED, Corning, NY (US)

(72) Inventors: Shinu Baby, Painted Post, NY (US); Kuan-Ting Kuo, Chubei (TW); Yousef Kayed Qaroush, Painted Post, NY (US); Robert Lee Smith, III, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 335 days.

(21) Appl. No.: 17/270,916

(22) PCT Filed: Aug. 13, 2019

(86) PCT No.: PCT/US2019/046263
§ 371 (c)(1),
(2) Date: Feb. 24, 2021

(87) PCT Pub. No.: WO2020/041032
PCT Pub. Date: Feb. 27, 2020

(65) Prior Publication Data
US 2021/0178730 A1    Jun. 17, 2021

Related U.S. Application Data

(60) Provisional application No. 62/722,309, filed on Aug. 24, 2018.

(51) Int. Cl.
*B32B 17/06*      (2006.01)
*B32B 7/12*       (2006.01)

(52) U.S. Cl.
CPC ............... *B32B 17/06* (2013.01); *B32B 7/12* (2013.01); *B32B 2307/558* (2013.01);
(Continued)

(58) Field of Classification Search
CPC ..... B32B 17/06; B32B 7/12; B32B 2307/558; B32B 2307/581; B32B 2307/584;
(Continued)

(56) References Cited

U.S. PATENT DOCUMENTS 8,312,739 B2    11/2012  Lee et al.
8,486,535 B1    7/2013   Nemeth et al.
(Continued)

FOREIGN PATENT DOCUMENTS

CN    103474580 A    12/2013
CN    105189391 A    12/2015
(Continued)

OTHER PUBLICATIONS

Chinese Patent Application No. 201980055584.3, Office Action dated Sep. 16, 2022, 5 pages (English translation only), Chinese Patent Office.
(Continued)

*Primary Examiner* — Christopher W Raimund
(74) *Attorney, Agent, or Firm* — Jeffrey A. Schmidt

(57) ABSTRACT

An article including a laminate having a substrate and an ultra-thin cover glass layer bonded to atop surface of the substrate. The ultra-thin cover glass layer has a thickness in the range of 1 micron to 49 microns. The ultra-thin cover glass layer is bonded to the top surface of the substrate with an optically transparent adhesive layer having a thickness in the range of 5 microns to 50 microns.

16 Claims, 12 Drawing Sheets

(52) U.S. Cl.
CPC ... *B32B 2307/581* (2013.01); *B32B 2307/584* (2013.01); *B32B 2457/20* (2013.01); *B32B 2571/00* (2013.01)

(58) Field of Classification Search
CPC . B32B 2457/20; B32B 2571/00; B32B 37/12; B32B 38/0012; H10K 50/841; G02F 1/133311; G02F 1/133331; G02F 1/133305; G06F 1/1626; G06F 1/1637; G06F 1/1656; C03C 3/083; C03C 17/002; C09J 7/20
See application file for complete search history.

(56) References Cited

U.S. PATENT DOCUMENTS

| | | | |
|---|---|---|---|
| 8,561,429 | B2 | 10/2013 | Allan et al. |
| 9,272,947 | B2 | 3/2016 | Baca et al. |
| 9,321,677 | B2 | 4/2016 | Chang et al. |
| 9,321,678 | B2 | 4/2016 | Chang et al. |
| 9,321,679 | B2 | 4/2016 | Chang et al. |
| 9,335,444 | B2 | 5/2016 | Hart et al. |
| 9,557,773 | B2 | 1/2017 | Chang et al. |
| 9,705,106 | B2 | 7/2017 | Son et al. |
| 9,898,046 | B2 | 2/2018 | Chang et al. |
| 10,809,766 | B2 | 10/2020 | Chu et al. |
| 10,824,200 | B2 | 11/2020 | Chang et al. |
| 2010/0246016 | A1 | 9/2010 | Carlson et al. |
| 2011/0019123 | A1* | 1/2011 | Prest ............... C03C 19/00 428/192 |
| 2011/0062849 | A1 | 3/2011 | Carlson et al. |
| 2011/0206903 | A1 | 8/2011 | Mazumder |
| 2011/0267697 | A1 | 11/2011 | Kohli et al. |
| 2011/0267698 | A1 | 11/2011 | Guilfoyle et al. |
| 2012/0034435 | A1 | 2/2012 | Borrelli et al. |
| 2012/0251827 | A1 | 10/2012 | Murata |
| 2012/0281292 | A1 | 11/2012 | Baca et al. |
| 2013/0130004 | A1 | 5/2013 | Milia et al. |
| 2013/0169590 | A1 | 7/2013 | Wickboldt et al. |
| 2014/0050911 | A1 | 2/2014 | Mauro et al. |
| 2014/0106146 | A1* | 4/2014 | Decker ............... C03C 17/3417 428/210 |
| 2014/0322547 | A1 | 10/2014 | Petzold et al. |
| 2015/0118276 | A1 | 4/2015 | Borrelli et al. |
| 2015/0198752 | A1 | 7/2015 | Lander et al. |
| 2015/0210589 | A1 | 7/2015 | Chang et al. |
| 2016/0002103 | A1 | 1/2016 | Wang et al. |
| 2016/0214889 | A1* | 7/2016 | Garner ............... C03C 3/076 |
| 2017/0349483 | A1 | 12/2017 | Gross et al. |
| 2018/0203173 | A1 | 7/2018 | Murashige et al. |
| 2019/0300425 | A1* | 10/2019 | Ikadai ............... B32B 27/32 |
| 2021/0034112 | A1 | 2/2021 | Chang et al. |

FOREIGN PATENT DOCUMENTS

| | | |
|---|---|---|
| CN | 108351547 A | 7/2018 |
| JP | 2013-032277 A | 2/2013 |
| JP | 2017-024177 A | 2/2017 |
| KR | 10-2014-0007252 A | 1/2014 |
| TW | 201739614 A | 11/2017 |
| WO | 2013/082477 A2 | 6/2013 |
| WO | 2013/082488 A2 | 6/2013 |
| WO | 2013/106629 A2 | 7/2013 |
| WO | 2013/106638 A1 | 7/2013 |
| WO | 2014/035942 A1 | 3/2014 |
| WO | 2015/116466 A1 | 8/2015 |
| WO | 2016/073551 A1 | 5/2016 |
| WO | 2017/066364 A1 | 4/2017 |
| WO | 2017/123899 A1 | 7/2017 |
| WO | 2018/055998 A1 | 3/2018 |
| WO | 2019/074932 A1 | 4/2019 |

OTHER PUBLICATIONS

International Search Report and Written Opinion of the International Searching Authority; PCT/US2019/046263; dated Oct. 23, 2019, 9 pages; European Patent Office.
"Ahead of the Curve: Samsung, LG Debut Flexible Displays", Retrieved from: https://electronics360.globalspec.com/article/3922/ahead-of-the-curve-samsung-lg-debut-flexible-displays, 2014, 3 pages.
H.Kwon et. al., "Mechanically and optically reliable folding structure with a hyperelastic material for seamless foldable displays", Applied Physics Letters 98, 2011, 4 pages.
Taiwanese Patent Application No. 108128838, Office Action dated Apr. 17, 2023, 3 pages (English Translation Only); Taiwanese Patent Office.
Japanese Patent Application No. 2021-534117, Office Action dated May 29, 2023, 9 pages (English Translation only), Japanese Patent Office.

* cited by examiner

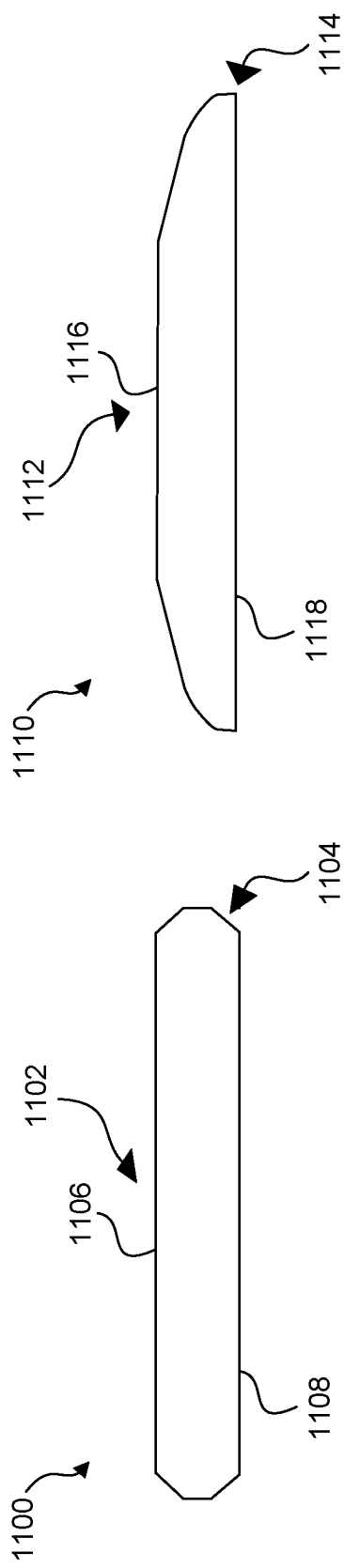
FIG. 11A
FIG. 11B
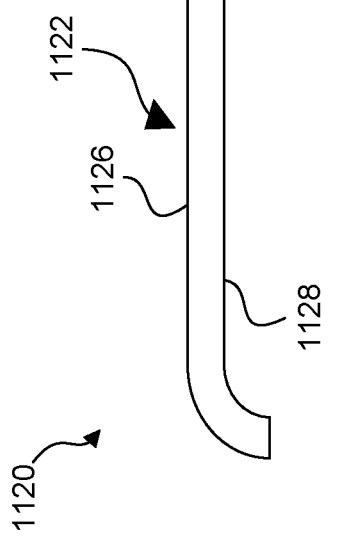
FIG. 11C

ARTICLE COMPRISING PUNCTURE RESISTANT LAMINATE WITH ULTRA-THIN GLASS LAYER

CROSS-REFERENCE TO RELATED APPLICATIONS

This application is a national stage entry of International Patent Application Serial No. PCT/US2019/046263, filed on Aug. 13, 2019, which in turn, claims the benefit of priority under 35 U.S.C. § 119 of U.S. Provisional Application Ser. No. 62/722,309 filed on Aug. 24, 2018, the contents of each of which are relied upon and incorporated herein by reference in their entireties.

BACKGROUND

Field

The present disclosure relates to puncture resistant laminates. In particular, the present disclosure relates to puncture and fracture resistant laminates including a glass layer bonded to a substrate with an adhesive layer.

Background

A cover substrate for a display of an electronic device protects a display screen and provides an optically transparent surface through which a user can view the display screen. Recent advancements in electronic devices (e.g., handheld and wearable devices) are trending towards lighter devices with improved reliability. The weight of different components of these devices, including protective components, for example cover glasses and substrates, have been reduced to create lighter devices.

Also, consumer electronic industries have been focusing on turning wearable and/or flexible concepts into consumer products for years. Recently, thanks to continuous development and improvement of plastic films, plastic-based cover substrates for devices have demonstrated some success in the market. However, the intrinsic drawbacks of using plastic cover substrates remain, for example low moisture and/or oxidation resistibility and low surface hardness, which can lead to device failure during use. The use of a plastic substrate for its flexibility, may in some situations, increase weight, reduce optical transparency, reduce scratch resistance, reduce puncture resistance, and/or reduce thermal durability for a cover substrate.

Therefore, a continuing need exists for innovations in covers for consumer products, for example cover substrates or glasses for protecting a display screen. And in particular, a continuing need exists for cover glasses or cover substrates for consumer devices including a flexible component, for example a flexible display screen.

BRIEF SUMMARY

The present disclosure is directed to flexible, puncture resistant, and fracture resistant laminates including an ultra-thin cover glass layer bonded to a substrate with an adhesive. The ultra-thin cover glass layer has a thickness of less than 50 micrometers (μm or microns). Unexpectedly, an ultra-thin cover glass layer having a thickness of less than 50 microns provides suitable puncture and fracture resistance when bonded to a substrate with a suitably thick adhesive layer. The puncture and fracture resistance together with the flexibility of such ultra-thin cover glass layers (having thicknesses less than 50 microns) produce a desirable combination of properties for a laminate as described herein.

Some embodiments are directed to an article including a laminate having a substrate; a cover glass layer bonded to a top surface of the substrate, the cover glass layer having a thickness in the range of 1 micron to 49 microns; and an optically transparent adhesive layer having a thickness in the range of 5 microns to 50 microns that bonds a bottom surface of the cover glass layer to the top surface of the substrate.

In some embodiments, the article according to the preceding paragraph may include a cover glass layer having a thickness in the range of 1 micron to 40 microns. In some embodiments, the article according to the preceding paragraph may include a cover glass layer having a thickness in the range of 1 micron to 30 microns. In some embodiments, the article according to the preceding paragraph may include a cover glass layer having a thickness in the range of 35 micron to 49 microns. In some embodiments, the article according to the preceding paragraph may include a cover glass layer having a thickness in the range of 25 micron to 49 microns.

In some embodiments, the article according to embodiments of any of the preceding paragraphs may include an optically transparent adhesive layer having a thickness in the range of 25 microns to 50 microns.

In some embodiments, the article according to embodiments of any of the preceding paragraphs may include a cover glass layer that is directly bonded to the top surface of the substrate with the optically transparent adhesive layer.

In some embodiments, the article according to embodiments of any of the preceding paragraphs may include a laminate that can achieve a bend radius of 3 millimeters (mm).

In some embodiments, the article according to embodiments of any of the preceding paragraphs may include a laminate that has an impact resistance defined by the capability of the cover glass layer to avoid failure at a puncture load of 2.25 kilograms-force or more in a Puncture Test.

In some embodiments, the article according to embodiments of any of the preceding paragraphs may include a laminate that has an impact resistance defined by the capability of the cover glass layer to avoid failure at a pen drop height of 8 centimeters or more, wherein the pen drop height is measured according to a Pen Drop Test.

In some embodiments, the article according to embodiments of any of the preceding paragraphs may include a cover glass layer that is a redrawn glass layer drawn to the thickness of the cover glass layer.

In some embodiments, the article according to embodiments of any of the preceding paragraphs may include a cover glass layer that includes an alkali-containing aluminosilicate glass.

In some embodiments, the article according to embodiments of any of the preceding paragraphs may include a cover glass layer including 55 mol % to 70 mol % $SiO_2$, 10 mol % to 20 mol % $Al_2O_3$, and 10 mol % to 20 mol % $Na_2O$.

In some embodiments, the article according to embodiments of any of the preceding paragraphs may include a cover glass layer that has a compressive stress at least at one of a top surface or the bottom surface of the cover glass layer, and a concentration of metal oxide that is different at least at two points through the thickness of the cover glass layer.

In some embodiments, the article according to embodiments of any of the preceding paragraphs may include a substrate that includes an electronic display having a display surface defining at least a portion of the top surface of the substrate.

In some embodiments, the article according to embodiments of any of the preceding paragraphs may include a coating layer disposed on a top surface of the cover glass layer. In some embodiments, the coating layer may include a coating layer selected from the group of an anti-reflection coating layer, an anti-glare coating layer, an anti-fingerprint coating layer, an anti-splinter layer, an anti-microbial coating layer, and an easy-to-clean coating layer.

In some embodiments, the article according to embodiments of any of the preceding paragraphs may include a laminate devoid of a polymeric hard-coating layer disposed on a top surface of the cover glass layer.

In some embodiments, the article according to embodiments of any of the preceding paragraphs may be a consumer electronic product and the substrate may include an electronic display, the consumer electronic product including a housing comprising a front surface, a back surface and side surfaces; and electrical components at least partially within the housing, the electrical components including a controller, a memory, and the electronic display, the electronic display at or adjacent the front surface of the housing, where the cover glass layer forms at least a portion of the housing.

Some embodiments are directed to an electronic display component including an electronic display including a display surface; a cover glass layer bonded to the display surface, the cover glass layer including a thickness in the range of 1 micron to 49 microns; and an optically transparent adhesive layer having a thickness in the range of 5 microns to 50 microns that bonds a bottom surface of the cover glass layer to the display surface of the electronic display.

In some embodiments, the display component according to the embodiment of the preceding paragraph may include a coating layer disposed on a top surface of the glass layer.

In some embodiments, the display component according to the embodiments of either of the previous two paragraphs may include a cover glass layer that is directly bonded to the display surface of the electronic display with the optically transparent adhesive layer.

Some embodiments are directed to a method of making a laminate, the method including bonding a cover glass layer to a top surface of a substrate, the cover glass layer having a thickness in the range of 1 microns to 49 microns, where a bottom surface of the cover glass layer is bonded to the top surface of the substrate with an optically transparent adhesive layer having a thickness in the range of 5 microns to 50 microns.

In some embodiments, the method according to the embodiment of the preceding paragraph may include forming the cover glass layer with a redrawing process, where the redrawing process includes redrawing the cover glass layer to the thickness of the cover glass layer.

In some embodiments, the method according to the embodiments of either of the two previous paragraphs may include coating a top surface of the cover glass layer with a coating layer.

BRIEF DESCRIPTION OF THE DRAWINGS

The accompanying figures, which are incorporated herein, form part of the specification and illustrate embodiments of the present disclosure. Together with the description, the figures further serve to explain the principles of and to enable a person skilled in the relevant art(s) to make and use the disclosed embodiments. These figures are intended to be illustrative, not limiting. Although the disclosure is generally described in the context of these embodiments, it should be understood that it is not intended to limit the scope of the disclosure to these particular embodiments. In the drawings, like reference numbers indicate identical or functionally similar elements.

FIGS. 11A-11C illustrate cover glass layers according to various embodiments.

DETAILED DESCRIPTION

Figure 1:
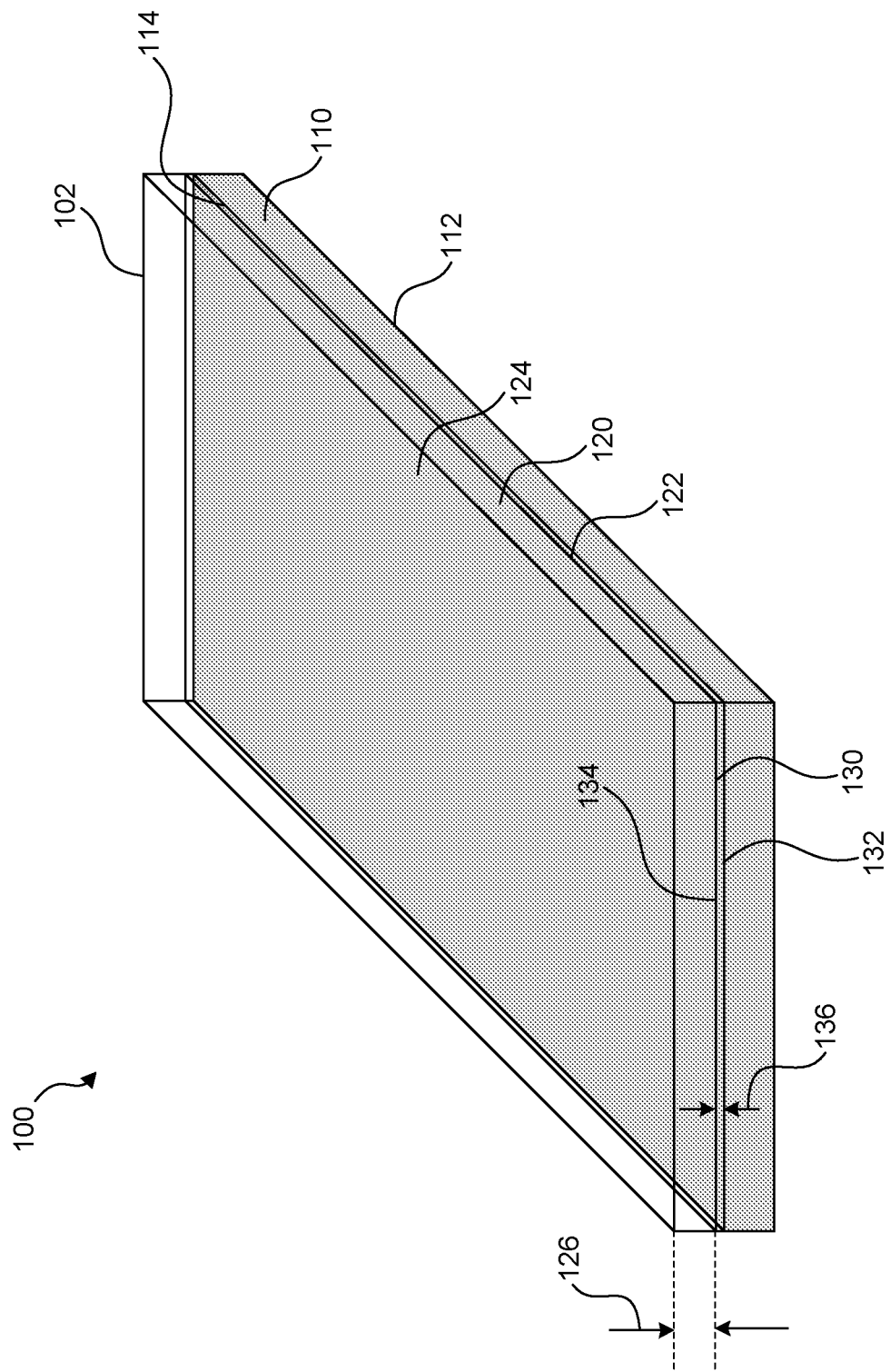
FIG. 1 illustrates an article according to some embodiments.

The following examples are illustrative, but not limiting, of the present disclosure. Other suitable modifications and adaptations of the variety of conditions and parameters normally encountered in the field, and which would be apparent to those skilled in the art, are within the spirit and scope of the disclosure.

Cover substrates for consumer products, for example cover glasses, may serve to, among other things, reduce undesired reflections, prevent formation of mechanical defects in the glass (e.g., scratches or cracks), and/or provide an easy-to-clean transparent surface. The cover glasses and laminates disclosed herein may be incorporated into another article for example an article with a display (or display articles) (e.g., consumer electronic products, including mobile phones, tablets, computers, navigation systems, wearable devices (e.g., watches) and the like), architectural articles, transportation articles (e.g., automotive, trains, aircraft, sea craft, etc.), appliance articles, or any article that may benefit from some transparency, scratch-resistance, abrasion resistance, or a combination thereof.

An exemplary article incorporating any of the cover glass layers or laminates disclosed herein is a consumer electronic device including a housing having front, back, and side surfaces; electrical components that are at least partially inside or entirely within the housing and including at least a controller, a memory, and a display at or adjacent to the front surface of the housing; and a cover glass layer at or over the front surface of the housing such that it is over the display. In some embodiments, the cover glass layer may include any of the glass layers disclosed herein. In some embodiments, at least one of a portion of the housing or the display comprises a cover glass layer or laminate as disclosed herein. As used herein, a "laminate" is a multi-layer structure including at least a cover glass layer and a substrate bonded together with an adhesive layer disposed between the cover glass layer and the substrate.

Cover substrates, for example cover glasses, also serve to protect sensitive components of a consumer product from mechanical damage (e.g., puncture and impact forces). For consumer products including a flexible, foldable, and/or sharply curved portion (e.g., a flexible, foldable, and/or sharply curved display screen), a cover substrate for protecting the display screen should preserve the flexibility, foldability, and/or curvature of the screen while also protecting the screen. Moreover, the cover substrate should resist mechanical damage, for example scratches and fracturing, so that a user can enjoy an unobstructed view of the display screen.

Thick monolithic glass layers may provide adequate mechanical properties, but these layers can be bulky and incapable of folding to tight radii in order to be utilized in foldable, flexible, or sharply curved consumer products. And highly flexible cover substrates, for example plastic substrates, may be unable to provide adequate puncture resistance, scratch resistance, and/or fracture resistance desirable for consumer products.

As a cover substrate, compared to plastic, glass provides a superior barrier to moisture (and oxygen) and provides hardness properties to minimize scratch and deformation damage during use. And ultra-thin glass can be bent to very small bending radii. The bending of a foldable article or laminate to tight bend radii is driven by the overall stiffness of the article or laminate. Due to high glass modulus, a cover glass layer of the article or laminate primarily contributes to the stiffness of the article or laminate. Hence, thinner cover glass layers are desired to facilitate bending of the article or laminate. Accordingly, a cover substrate defined by or including an ultra-thin glass layer that provides adequate puncture resistance, scratch resistance, and/or fracture resistance is capable of serving as a cover substrate. Such an ultra-thin glass layer (having thicknesses less than 50 microns) may reduce the number of layers to produce a cover substrate having suitable mechanical properties.

Articles described herein include an ultra-thin cover glass layer having a thickness of less than 50 micrometers (microns) (i.e., 49 microns or less, for example 48 microns, or 47 microns, or 46 microns, or 45 microns, or 40 microns, or 35 microns, or 30 microns, or 25 microns, or any and all subranges therebetween). Unexpectedly, compared to a cover glass layer having a thickness of 50 microns and bonded to a substrate with an adhesive, a cover glass layer having a thickness of less than 50 microns provides superior puncture and fracture resistance when bonded to a similar substrate with a similar adhesive layer. Previously it was believed that as glass thickness was reduced below 50 microns, puncture and fracture resistance would be similarly reduced due to the thinness of the glass layer. However, this is not the case for cover glass layers adhesively bonded to a substrate with a suitably thick adhesive layer.

In particular, unexpectedly, for ultra-thin cover glass layers having a thickness less than 50 microns, stresses that develop in a cover glass layer are inversely proportional to the stiffness of the layer bonded to a substrate. High stresses that lead to the failure of a cover glass during puncture testing or pen drop testing are due to localized bending of the glass. Hence, it was previously believed that stiffness of a cover glass was consistently and directly related to puncture and fracture resistance. This was the understanding because it was believed that stresses that develop in a cover glass layer due to a puncture force would always be inversely proportional to the stiffness of the glass layer. Because of this, it was believed that comparatively, a thicker, stiffer cover glass layer would always improve pen drop and puncture test performance, and therefore puncture and fracture resistance.

However, it has been discovered that a cover glass layer having a thickness less than 50 microns can provide suitable puncture failure load and pen drop performance for a laminate. As disclosed herein, cover glass layer thicknesses less than 50 microns show better performance than a 50 micron thick cover glass layer. And cover glass layer thicknesses less than 50 microns show similar performance to cover glass layer thicknesses greater than 50 microns and up to about 100 microns when subjected to pen drop or quasi-static indentation loading (puncture forces). However, a cover glass layer thickness of less than 50 microns will have superior flexibility and bending properties compared to a cover glass layer made of the same material with a thicknesses of 50 microns or more. Superior flexibility and bendability of such cover glass layers (having thicknesses less than 50 microns) allows them to bend through smaller bend radii without failure. Further, since these thinner cover glass layers reduce the amount of raw material to make a cover glass layer that offers desirable protection, they may reduce manufacturing costs.

Laminates including cover glass layers bonded to a substrate and having a thickness of less than 50 microns performed better during pen drop performance testing than comparable glass layers having a thickness of 50 microns and similarly bonded to a similar substrate. To confirm this unexpected behavior, further laminates were tested using a Puncture Test with controlled loading by an INSTRON® machine (a controlled puncture test machine manufactured by Illinois Tool Works Inc.). Information related to damage initiation and propagation can be derived from the results of this puncture testing. This information is difficult, if not impossible, to obtain through a pen drop experiment. Puncture testing allows monitoring controlled fracture during the quasi-static loading. In other words, it helps to distinguish which layer of a laminate failed first since it can be stopped immediately after the first sensed fracture. Stopping after the first sensed fracture helps differentiate between failure of a cover glass layer and/or a substrate to which the cover glass layer is bonded. The puncture test results confirmed that cover glass layers having a thickness of less than 50 microns have superior puncture and fracture resistance than comparable 50 micron thick cover glass layers.

In light of the unexpected pen drop and puncture tests, the behavior of laminates including cover glass layers bonded to a substrate were modeled to evaluate the stress profiles created by puncture forces imparted on a surface of the cover glass layers. The model results show that stress levels for cover glass layers having a thickness of less than 50 microns are, in total, less than those for comparable cover glass layers having a thickness of 50 microns. These modeled results confirmed that cover glass layers having a thickness of less than 50 microns and bonded to a substrate with a suitably thick adhesive are superior in resisting failure due to puncture or impact forces compared to a 50 micron thick cover glass layer similarly bonded to a similar substrate.

Less than 50 micron thick cover glass layers bonded to a substrate as described herein provide adequate flexibility, puncture resistance, scratch resistance, and fracture resistance to serve as a protective component for the substrate and an article including the substrate.

FIG. 1 illustrates an article 100 according to some embodiments. Article 100 includes a laminate 102 having a substrate 110 and a cover glass layer 120 bonded to the substrate 110 with an optically transparent adhesive layer 130. Cover glass layer 120 may cover all or a portion of substrate 110. Cover glass layer 120 may cover all or a portion of a top surface 114 of substrate 110. In some embodiments, cover glass layer 120 may cover the entirety of top surface 114. In some embodiments, cover glass layer 120 may cover top surface 114 of substrate 110 between all opposing edges of top surface 114 but not over the entirety of the top surface.

In some embodiments, substrate 110 may be an electronic display or electronic display component including an electronic display. In some embodiments, all or a portion of top surface 114 of substrate 110 may be a display surface of the electronic display or electronic display component. In other words, the display surface may define all or a portion of top surface 114 of substrate 110. Exemplary electronic displays include a light emitting diode (LED) display or an organic light emitting diode (OLED) display. In some embodiments substrate 110 may be a non-electronic display device. For example, substrate 110 may be a display device that displays static or printed indicia. In some embodiments, substrate 110 may be a touch sensor, for example a capacitive touch sensor, or a polarizer, or a battery.

Figure 9:
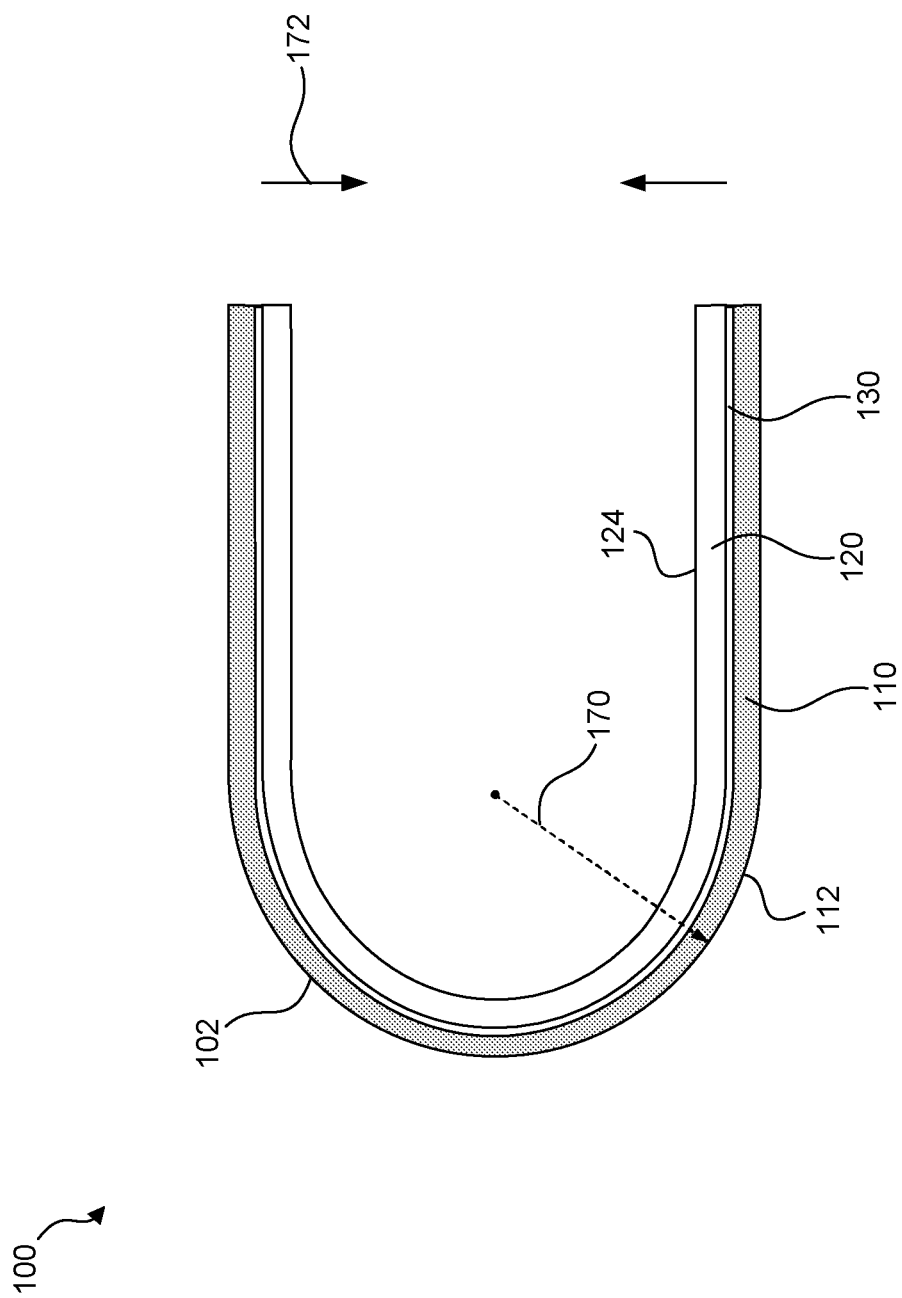
FIG. 9 illustrates a cross-sectional view of the article of FIG. 1 upon bending of the article.

In some embodiments, substrate 110, for example an electronic display or electronic display component, may be a flexible substrate. As used herein, a flexible layer, article, or substrate is a layer, article, or substrate may achieve a bend radius, by itself, of 10 mm or less. In some embodiments, substrate 110 may achieve a bend radius of 5 mm or less. In some embodiments, substrate 110 may achieve a bend radius of 4 mm or less. In some embodiments, substrate 110 may achieve a bend radius of 3 mm or less. Substrate 110 achieves a bend radius of "X" if it resists failure when substrate 110 is held at "X" radius for 60 minutes at about 25° C. and about 50% relative humidity. FIG. 9 illustrates the measurement of a bend radius 170 of laminate 102, and also substrate 110.

Cover glass layer 120 is an ultra-thin glass layer having a thickness 126 less than 50 microns. Cover glass layer 120 may have a thickness 126 measured from a bottom surface 122 to a top surface 124 of cover glass layer 120 in the range of 1 micron to 49 microns (micrometers, µm), including subranges therebetween. For example, cover glass layer 120 may have a thickness 126 of 1 micron, 5 microns, 10 microns, 15 microns, 20 microns, 25 microns, 30 microns, 35 microns, 40 microns, 45 microns, 46 microns, 47 microns, 48 microns, 49 microns, or within a range having any two of these values as endpoints. In some embodiments, thickness 126 may be in the range of 1 micron to 40 microns, or from 2 microns to 35 microns, or from 3 microns to 30 microns, or from 4 microns to 30 microns, or from 5 microns to 30 microns, or from 6 microns to 25 microns, or from 7 microns to 20 microns, or from 10 microns to 20 microns, or from 15 microns to 20 microns, or from 15 microns to 25 microns, or from 15 microns to 30 microns, or from 15 microns to 35 microns, or from 15 microns to 40 microns, or from 15 microns to 45 microns, or from 15 microns to 49 microns. In some embodiments, thickness 126 may be in the range of 1 micron to 30 microns. In some embodiments, thickness 126 may be in the range of 35 to 49 microns. In some embodiments, thickness 126 may be in the range of 25 microns to 49 microns. In some embodiments, thickness 126 may be in the range of 15 microns to 49 microns. In some embodiments, thickness 126 may be in the range of 5 microns to 49 microns.

Cover glass layer 120 may achieve a bend radius of 10 mm or less. In some embodiments, cover glass layer 120 may achieve a bend radius of 5 mm or less. In some embodiments, cover glass layer 120 may achieve a bend radius of 4 mm or less. In some embodiments, cover glass layer 120 may achieve a bend radius of 3 mm or less.

In some embodiments, cover glass layer 120 may include an alkali-containing aluminosilicate glass material. Other suitable materials for cover glass layer 120 include glass materials, for example but not limited to, soda lime glass, alkali-containing borosilicate glass, and alkali aluminoborosilicate glass. In some variants, the glass material may be free of lithia. In other embodiments, the glass material may contain lithia.

In some embodiments, cover glass layer 120 may be a redrawn glass layer. In some embodiments, cover glass layer 120 may be a glass layer formed using a process devoid of a chemical thinning process (i.e., cover glass layer 120 may be a non-chemically thinned glass layer). As used herein, the term "redrawn cover glass layer" means a layer of glass material that was drawn to its final thickness in a redrawing process. For example, in a redrawing process, a glass block may be heated to a desired drawing temperature and stretched by draw rollers (in a non-quality area, for example, an area disposed inward of the edges of the glass and/or an area which is intended to be used to make devices) to reduce its thickness to the final thickness of a cover glass layer. After redrawing to the final thickness, no additional process steps are utilized to significantly change the thickness of the cover glass layer. Grinding or polishing may be used to shape the edges of a redrawn cover glass layer, but such grinding or polishing is not considered as changing the thickness of the layer. As used herein, the term "chemically thinned cover glass layer" means a layer of glass material that was subjected to one or more chemical etching processes to reduce its thickness to the final desired thickness of the glass layer. A chemically thinned (also called etched) glass layer will have different properties than a redrawn glass layer due to the etching process(es) used to reduce its thickness. For example, surfaces of a redrawn glass layer may be significantly smoother than surfaces of a chemically thinned glass layer. The surface roughness for a redrawn glass layer can be as small as about 0.1 nm (nanometers)-0.2 nm while the minimum surface roughness of a chemically thinned glass layer is about 2 nm-3 nm.

In some embodiments, cover glass layer 120 may be a strengthened glass layer, for example a glass layer that has been subject to an ion-exchange process or a thermal tempering process. For a cover glass layer 120 subject to an ion-exchange process, the cover glass layer 120 includes a compressive stress at top surface 124 and/or bottom surface 122 and a concentration of metal oxide that is different at least at two points through thickness 126 of the cover glass layer 120. In some embodiments, cover glass layer 120 may be a non-strengthened glass layer, for example a glass layer that has not been subject to an ion-exchange process or a thermal tempering process.

Unless indicated otherwise, cover glass layer 120 is a single monolithic layer. As used herein, "single monolithic layer" means a single integrally formed layer having a generally consistent composition across its volume. A layer that is made by layering one or more layers or materials, or by mechanically attaching different layers, is not considered a single monolithic layer.

Optically transparent adhesive layer 130 is disposed over top surface 114 of substrate 110 and bonds cover glass layer 120 to substrate 110. In some embodiments, optically transparent adhesive layer 130 may be disposed on top surface 114 of substrate 110. In such embodiments, a bottom surface 132 of optically transparent adhesive layer 130 is in direct contact with top surface 114 of substrate 110. As used herein, "disposed on" means that a first layer and/or component is in direct contact with a second layer and/or component. A first layer and/or component "disposed on" a second layer and/or component may be deposited, formed, placed, or otherwise applied directly onto the second layer and/or component. In other words, if a first layer and/or component is disposed on a second layer and/or component, there are no layers disposed between the first layer and/or component and the second layer and/or component. A first layer and/or component described as "bonded to" a second layer and/or component means that the layers and/or components are bonded to each other, either by direct contact and/or bonding between the two layers and/or components or via an adhesive layer. If a first layer and/or component is described as "disposed over" a second layer and/or component, other layers may or may not be present between the first layer and/or component and the second layer and/or component.

Suitable optically transparent adhesives for layer 130 include, but are not limited to acrylic adhesives, for example 3M™ 8212 adhesive, or any optically transparent liquid adhesive, for example a Loctite® optically transparent liquid adhesive. Optically transparent adhesive layer 130 may have a thickness 136, measured from bottom surface 132 to a top surface 134 of optically transparent adhesive layer 130, in the range of 5 microns to 50 microns, including subranges. For example, thickness 136 of optically transparent adhesive layer 130 may be 5 microns, 10 microns, 15 microns, 20 microns, 25 microns, 30 microns, 35 microns, 40 microns, 45 microns, 50 microns, or within a range having any two of these values as endpoints. In some embodiments, thickness 136 may be in the range of 25 microns to 50 microns. In some embodiments, thickness 136 may be from 5 microns to 49 microns, or from 5 microns to 45 microns, or from 5 microns to 40 microns, or from 5 microns to 35 microns, or from 5 microns to 30 microns, or from 5 microns to 25 microns, or from 5 microns to 20 microns, or from 5 microns to 15 microns, or from 5 microns to 48 microns or from 10 microns to 45 microns, or from 15 microns to 45 microns, or from 20 microns to 45 microns, or from 25 microns to 45 microns, or from 30 microns to 45 microns, or from 35 microns to 45 microns, or from 6 microns to 48 microns, or from 10 microns to 42 microns, or from 15 microns to 37 microns, or from 20 microns to 32 microns, or from 25 microns to 30 microns.

As used herein, "optically transparent" means an average transmittance of 70% or more in the wavelength range of 400 nm to 700 nm through a 1.0 mm thick piece of a material. In some embodiments, an optically transparent material may have an average transmittance of 75% or more, 80% or more, 85% or more, or 90% or more in the wavelength range of 400 nm to 700 nm through a 1.0 mm thick piece of the material. The average transmittance in the wavelength range of 400 nm to 700 nm is calculated by measuring the transmittance of whole number wavelengths from about 400 nm to about 700 nm and averaging the measurements. Cover glass layer 120 may be optically transparent.

In some embodiments, bottom surface 122 of cover glass layer 120 may be in direct contact with top surface 134 of optically transparent adhesive layer 130. In some embodiments, cover glass layer 120 may be directly bonded to top surface 114 of substrate 110 via optically transparent adhesive layer 130. In such embodiments, bottom surface 122 of cover glass layer and top surface 114 of substrate 110 are in direct contact with top surface 134 and bottom surface 132 of optically transparent adhesive layer 130, respectively.

In some embodiments, top surface 124 of cover glass layer 120 may be a topmost exterior, user-facing surface of laminate 102 and/or article 100. As used herein, the terms "top surface" or "topmost surface" and "bottom surface" or "bottommost surface" reference the top and bottom surface of a layer, component, or article as is would be oriented during its normal and intended use with the top surface being the user-facing surface. For example, when incorporated into a hand-held consumer electronic product having an electronic display, the "top surface" of an article, layer, or laminate refers to the top surface of that article, laminate, or layer as it would be oriented when held by a user viewing the electronic display through the article, laminate, or layer.

In some embodiments, top surface 124 of cover glass layer 120 may be coated with one or more coating layers (e.g., a coating layer 180) to provide desired characteristics. Such coating layers include, but are not limited to, polymeric hard-coating layers, anti-reflection coating layers, anti-glare coating layers, anti-fingerprint coating layers, anti-splinter layers, anti-microbial and/or anti-viral coating layers, and easy-to-clean coating layers. In some embodiments, laminate 102 may be devoid of a coating layer (e.g., a coating layer 180) disposed over or bonded to top surface 124 of cover glass layer 120. In some embodiments, laminate 102 may be devoid of a polymeric hard-coating layer disposed over or bonded to top surface 124 of cover glass layer 120. A polymeric hard-coating layer, for example the optically transparent polymeric (OTP) hard-coat layers described herein, is a layer with significant hardness configured to improve puncture and/or fracture resistance of a laminate. A cover glass layer 120 coated with one or more coating layers, or not coated with any coating layers, may be referred to as a "cover substrate."

Article 100 and/or laminate 102 may achieve a bend radius 170 of 10 mm or less. In some embodiments, article 100 and/or laminate 102 may achieve a bend radius 170 of 5 mm or less. In some embodiments, article 100 and/or laminate 102 may achieve a bend radius 170 of 4 mm or less. In some embodiments, article 100 and/or laminate 102 may achieve a bend radius 170 of 3 mm or less. FIG. 9 illustrates the bending force 172 applied to article 100 and/or laminate 102 to bend it to bend radius 170. As show in FIG. 9, bend radius 170 may be measured relative to bottom surface 112 of substrate 110 with top surface 124 of glass layer 120 bent toward itself. As such, substrate 110 has a bend radius 170 as shown in FIG. 9 and glass layer 120 has a bend radius less than the bend radius of substrate 110.

In some embodiments, laminate 102 may have an impact resistance defined by the capability of cover glass layer 120 to avoid failure at a pen drop height of 8 centimeters (cm) or more, when measured according to the "Pen Drop Test." In some embodiments, laminate 102 may have an impact resistance defined by the capability of cover glass layer 120 to avoid failure at a pen drop height of 9 cm or more, when measured according to the "Pen Drop Test." In some embodiments, laminate 102 may have an impact resistance defined by the capability of cover glass layer 120 to avoid failure at a pen drop height of 10 cm or more, when measured according to the "Pen Drop Test."

As described and referred to herein, the "Pen Drop Test" is conducted such that samples of laminates are tested with the load (i.e., from a pen dropping at a certain height) imparted to a top surface of a cover glass layer with the bottom surface of the cover glass layer bonded to a 100 micron thick layer of polyethylene terephthalate (PET), acting as the substrate for the laminate, with a 50 micron thick optically transparent adhesive layer. The PTE layer in the Pen Drop Test is meant to simulate a flexible electronic display device (e.g., an OLED device). During testing, the cover glass layer bonded to the PET layer is placed on an aluminum plate (6063 aluminum alloy, as polished to a surface roughness with 400 grit paper) with the PET layer in contact with the aluminum plate. No tape is used on the side of the sample resting on the aluminum plate.

A tube is used for the Pen Drop Test to guide a pen to the sample, and the tube is placed in contact with the top surface of the sample so that the longitudinal axis of the tube is substantially perpendicular to the top surface of the sample. The tube has an outside diameter of 1 inch (2.54 cm), an inside diameter of nine sixteenths of an inch (1.4 cm) and a length of 90 cm. An acrylonitrile butadiene ("ABS") shim is employed to hold the pen at a desired height for each test. After each drop, the tube is relocated relative to the sample to guide the pen to a different impact location on the sample. The pen employed in Pen Drop Test is a BIC® Easy Glide Pen, Fine, having a tungsten carbide ball point tip of 0.7 mm (0.68 mm) diameter, and a weight of 5.73 grams (g) including the cap (4.68 g without the cap).

For the Pen Drop Test, the pen is dropped with the cap attached to the top end (i.e., the end opposite the tip) so that the ball point can interact with the test sample. In a drop sequence according to the Pen Drop Test, one pen drop is conducted at an initial height of 1 cm, followed by successive drops in 0.5 cm increments up to 20 cm, and then after 20 cm, 2 cm increments until failure of the test sample. After each drop is conducted, the presence of any observable fracture, failure or other evidence of damage to the sample is recorded along with the particular pen drop height. Using the Pen Drop Test, multiple samples can be tested according to the same drop sequence to generate a population with improved statistics. For the Pen Drop Test, the pen is to be changed to a new pen after every 5 drops, and for each new sample tested. In addition, all pen drops are conducted at random locations on the sample at or near the center of the sample, with no pen drops near or on the edge of the samples.

Figure 2:
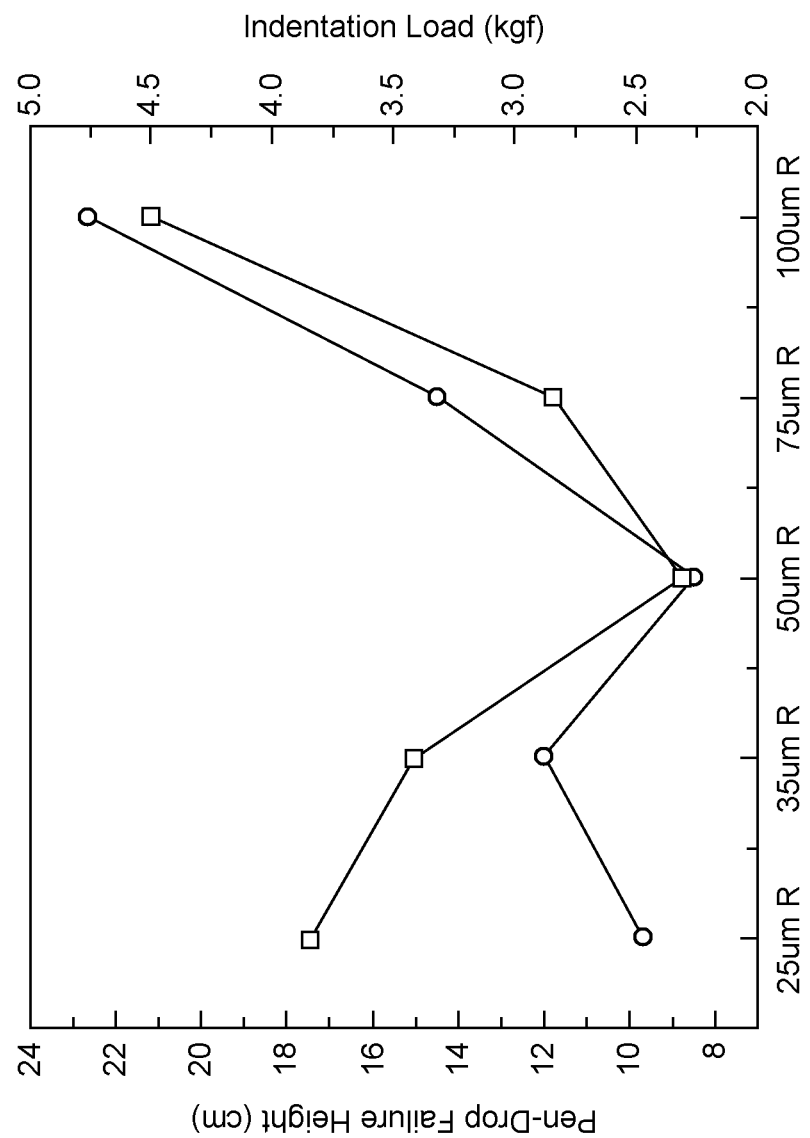
FIG. 2 is a graph of pen drop failure height and indentation load for various test samples having the test sample configuration of FIG. 4 with redrawn cover glass layers.
Figure 3:
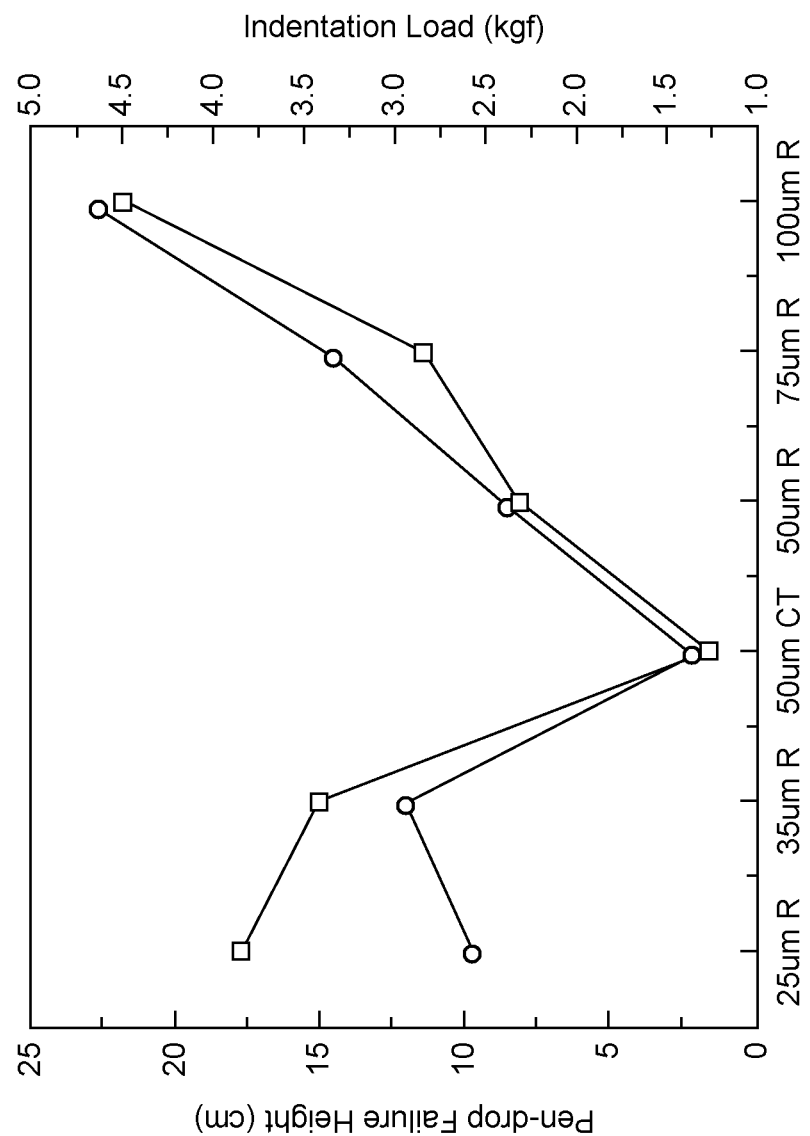
FIG. 3 is a graph of pen drop failure height and indentation load for various test samples having the test sample configuration of FIG. 4 with redrawn and chemically thinned cover glass layers.

For purposes of the Pen Drop Test, "failure" means the formation of a visible mechanical defect in a laminate. The mechanical defect may be a crack or plastic deformation (e.g., surface indentation). The crack may be a surface crack or a through crack. The crack may be formed on an interior or exterior surface of a laminate. The crack may extend through all or a portion of the layers of a laminate. A visible mechanical defect has minimum dimension of 0.2 millimeters or more. The graphs of FIGS. 2 and 3 show the drop height at failure versus cover glass layer thickness for various test samples having the configuration of test sample 400 tested according to the Pen Drop Test.

In some embodiments, laminate 102 may have an impact resistance defined by the capability of cover glass layer 120 to avoid failure at a puncture load of 2.25 kilograms-force or more in the "Puncture Test." In some embodiments, laminate 102 may have an impact resistance defined by the capability of cover glass layer 120 to avoid failure at a puncture load of 2.5 kilograms-force or more in the "Puncture Test." In some embodiments, laminate 102 may have an impact resistance defined by the capability of cover glass layer 120 to avoid failure at a puncture load of 2.75 kilograms-force or more in the "Puncture Test." In some embodiments, laminate 102 may have an impact resistance defined by the capability of cover glass layer 120 to avoid failure at a puncture load of 3 kilograms-force or more in the "Puncture Test." In some embodiments, laminate 102 may have an impact resistance defined by the capability of cover glass layer 120 to avoid failure at a puncture load of 3.25 kilograms-force or more in the "Puncture Test."

As described and referred to herein, the "Puncture Test" is conducted such that samples of laminates are tested with the load imparted to a top surface of a cover glass layer with the bottom surface of the cover glass layer bonded to a 100 micron thick layer of polyethylene terephthalate (PET), acting as the substrate for the laminate, with a 50 micron thick optically transparent adhesive layer. The PET layer in the Puncture Test is meant to simulate a flexible electronic display device (e.g., an OLED device). During the Puncture Test, the top surface of the cover glass layer is loaded with a stainless steel pin having a flat bottom with a 200 micron diameter. Puncture Testing according to this disclosure is performed under displacement control at 0.5 mm/minute cross-head speed. This quasi-static loading testing (indentation) is carried out by utilizing an INSTRON® machine (a controlled puncture test machine manufactured by Illinois Tool Works Inc.). During testing, a sample is placed under the pin tip and the load is increased until failure is observed. At failure, the puncture load, measured in kilograms-force (kgf) is recorded. The stainless steel pin is replaced with a new pin after a specified quantity of tests (i.e., 10 tests) to avoid bias that could result from deformation of the metal pin associated with the testing.

For purposes of the Puncture Test, "failure" means the formation of a visible mechanical defect in a laminate. The mechanical defect may be a crack or plastic deformation (e.g., surface indentation). The crack may be a surface crack or a through crack. The crack may be formed on an interior or exterior surface of a laminate. The crack may extend through all or a portion of the layers of a laminate. A visible mechanical defect has minimum dimension of 0.2 millimeters or more. The graphs of FIGS. 2 and 3 show the indentation load at failure versus cover glass layer thickness for various test samples having the configuration of test sample 400 tested according to the Puncture Test.

Figure 4:
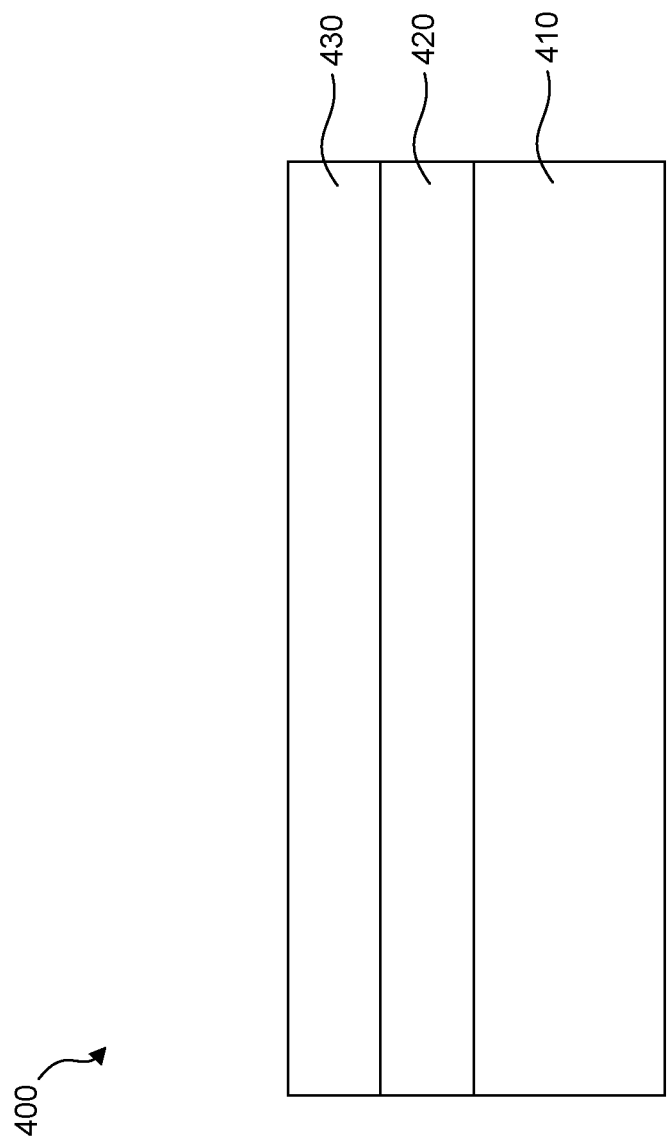
FIG. 4 illustrates a test sample configuration.

Each test sample 400 included a cover glass layer 430 bonded to a 100 micron thick PTE substrate 410 with a 50 micron thick optically clear adhesive layer 420 as shown in FIG. 4. The cover glass layers 430 tested include redrawn cover glass layers (labeled with "R" in FIGS. 2 and 3) and chemically thinned cover glass layers (labeled with "CT" in FIG. 3.) Each cover glass layer 430 was a glass layer comprising an alkali-containing aluminosilicate glass having the composition of Composition 1 in Table 1. Each cover glass layer 430 was a non-strengthened cover glass layer. Test samples 400 included the following cover glass layers: (i) a 25 micron thick redrawn cover glass layer 430, (ii) a 35 micron thick redrawn cover glass layer 430, (iii) a 50 micron thick chemically-thinned cover glass layer 430, (iv) a 50 micron thick redrawn cover glass layer 430, (v) a 75 micron thick redrawn cover glass layer 430, and (vi) a 100 micron thick redrawn cover glass layer 430.

While the test results reported in FIGS. 2 and 3 are the results of tests performed on glass layers having the composition of Composition 1, the trends illustrated in the results are not dependent on the particular aluminosilicate glass composition tested. Similar test results show the same trends for other glass compositions, including Compositions 2-5 in Table 1. Other suitable glass materials for cover glass layers discussed herein include soda lime glass, alkali-containing borosilicate glass, and alkali aluminoborosilicate glass. In some variants, the glass material may be free of lithia. These glass materials may be strengthened or non-strengthened.

In some embodiments, the glass composition for glass layers discussed herein may include 40 mol % to 90 mol % $SiO_2$ (silicon oxide). In some embodiments, the glass composition may include 40 mol %, 45 mol %, 50 mol %, 55 mol %, 60 mol %, 65 mol %, 70 mol %, 75 mol %, 80 mol %, 85 mol %, or 90 mol % $SiO_2$, or a mol % within any range having any two of these values as end points. In some embodiments, the glass composition may include 55 mol % to 70 mol % $SiO_2$. In some embodiments, the glass composition may include 57.43 mol % to 68.95 mol % $SiO_2$.

In some embodiments, the glass composition for glass layers discussed herein may include 1 mol % to 10 mol % $B_2O_3$ (boron oxide). In some embodiments, the glass composition may include 1 mol %, 2 mol %, 3 mol %, 4 mol %, 5 mol %, 6 mol %, 7 mol %, 8 mol %, 9 mol %, or 10 mol % $B_2O_3$, or a mol % within any range having any two of these values as end points. In some embodiments, the glass composition may include 3 mol % to 6 mol % $B_2O_3$. In some embodiments, the glass composition may include 3.86 mol % to 5.11 mol % $B_2O_3$. In some embodiments, the glass composition may not include $B_2O_3$.

In some embodiments, the glass composition for glass layers discussed herein may include 5 mol % to 30 mol % $Al_2O_3$ (aluminum oxide). In some embodiments, the glass composition may include 5 mol %, 10 mol %, 15 mol %, 20 mol %, 25 mol %, or 30 mol % $Al_2O_3$, or a mol % within any range having any two of these values as end points. In some embodiments, the glass composition may include 10 mol % to 20 mol % $Al_2O_3$. In some embodiments, the glass composition may include 10.27 mol % to 16.10 mol % $Al_2O_3$.

In some embodiments, the glass composition for glass layers discussed herein may include 1 mol % to 10 mol % $P_2O_5$ (phosphorus oxide). In some embodiments, the glass composition may include 1 mol %, 2 mol %, 3 mol %, 4 mol %, 5 mol %, 6 mol %, 7 mol %, 8 mol %, 9 mol %, or 10 mol % $P_2O$, or a mol % within any range having any two of these values as end points. In some embodiments, the glass composition may include 2 mol % to 7 mol % $P_2O_5$. In some embodiments, the glass composition may include 2.47 mol % to 6.54 mol % $P_2O_5$. In some embodiments, the glass composition may not include $P_2O_5$.

In some embodiments, the glass composition for glass layers discussed herein may include 5 mol % to 30 mol % $Na_2O$ (sodium oxide). In some embodiments, the glass composition may include 5 mol %, 10 mol %, 15 mol %, 20 mol %, 25 mol %, or 30 mol % $Na_2O$, or a mol % within any range having any two of these values as end points. In some embodiments, the glass composition may include 10 mol % to 20 mol % $Na_2O$. In some embodiments, the glass composition may include 10.82 mol % to 17.05 mol % $Na_2O$.

In some embodiments, the glass composition for glass layers discussed herein may include 0.01 mol % to 0.05 mol % $K_2O$ (potassium oxide). In some embodiments, the glass composition may include 0.01 mol %, 0.02 mol %, 0.03 mol %, 0.04 mol %, or 0.05 mol % $K_2O$, or a mol % within any range having any two of these values as end points. In some embodiments, the glass composition may include 0.01 mol % $K_2O$. In some embodiments, the glass composition may not include $K_2O$.

In some embodiments, the glass composition for glass layers discussed herein may include 1 mol % to 10 mol % MgO (magnesium oxide). In some embodiments, the glass composition may include 1 mol %, 2 mol %, 3 mol %, 4 mol %, 5 mol %, 6 mol %, 7 mol %, 8 mol %, 9 mol %, or 10 mol % MgO, or a mol % within any range having any two of these values as end points. In some embodiments, the glass composition may include 2 mol % to 6 mol % MgO. In some embodiments, the glass composition may include 2.33 mol % to 5.36 mol % MgO. In some embodiments, the glass composition may not include MgO.

In some embodiments, the glass composition for glass layers discussed herein may include 0.01 mol % to 0.1 mol % CaO (calcium oxide). In some embodiments, the glass composition may include 0.01 mol %, 0.02 mol %, 0.03 mol %, 0.04 mol %, 0.05 mol %, 0.06 mol %, 0.07 mol %, 0.08 mol %, 0.09 mol %, or 0.1 mol % CaO, or a mol % within any range having any two of these values as end points. In some embodiments, the glass composition may include 0.03 mol % to 0.06 mol % CaO. In some embodiments, the glass composition may not include CaO.

In some embodiments, the glass composition for glass layers discussed herein may include 0.01 mol % to 0.05 mol % $Fe_2O_3$ (iron oxide). In some embodiments, the glass composition may include 0.01 mol %, 0.02 mol %, 0.03 mol %, 0.04 mol %, or 0.05 mol % $Fe_2O_3$, or a mol % within any range having any two of these values as end points. In some embodiments, the glass composition may include 0.01 mol % $Fe_2O_3$. In some embodiments, the glass composition may not include $Fe_2O_3$.

In some embodiments, the glass composition for glass layers discussed herein may include 0.5 mol % to 2 mol % ZnO (zinc oxide). In some embodiments, the glass composition may include 0.5 mol %, 1 mol %, 1.5 mol %, or 2 mol % ZnO, or a mol % within any range having any two of these values as end points. In some embodiments, the glass composition may include 1.16 mol % ZnO. In some embodiments, the glass composition may not include ZnO.

In some embodiments, the glass composition for glass layers discussed herein may include 1 mol % to 10 mol % $Li_2O$ (lithium oxide). In some embodiments, the glass composition may include 1 mol %, 2 mol %, 3 mol %, 4 mol %, 5 mol %, 6 mol %, 7 mol %, 8 mol %, 9 mol %, or 10 mol % $Li_2O$, or a mol % within any range having any two of these values as end points. In some embodiments, the glass composition may include 5 mol % to 7 mol % $Li_2O$. In some embodiments, the glass composition may include 6.19 mol % $Li_2O$. In some embodiments, the glass composition may not include $Li_2O$.

In some embodiments, the glass composition for glass layers discussed herein may include 0.01 mol % to 0.3 mol % $SnO_2$ (tin oxide). In some embodiments, the glass composition may include 0.01 mol %, 0.05 mol %, 0.1 mol %, 0.15 mol %, 0.2 mol %, 0.25 mol %, or 0.3 mol %, $SnO_2$, or a mol % within any range having any two of these values as end points. In some embodiments, the glass composition may include 0.01 mol % to 0.2 mol % $SnO_2$. In some embodiments, the glass composition may include 0.04 mol % to 0.17 mol % $SnO_2$.

In some embodiments, the glass composition for glass layers discussed herein may be a composition including a value for $R_2O$ (alkali metal oxide(s))+RO (alkali earth metal oxide(s)) in the range of 10 mol % to 30 mol %. In some embodiments, $R_2O$+RO may be 10 mol %, 15 mol %, 20 mol %, 25 mol %, or 30 mol %, or a mol % within any range having any two of these values as end points. In some embodiments, $R_2O+RO$ may be in the range of 15 mol % to 25 mol %. In some embodiments, $R_2O+RO$ may be in the range of 16.01 mol % to 20.61 mol %.

have increased flexibility compared to a thicker cover glass layer made of the same material.

In addition to testing five thicknesses of redrawn cover glass layers 430, one thickness of chemically thinned cover glass layer 430 was tested to determine whether a chemically thinned glass layer would perform better or worse than a redrawn glass layer. FIG. 3 shows a graph 300 of pen-drop failure height and indentation failure load values for the same five thicknesses of redrawn cover glass layers 430 shown in FIG. 2, and one thickness (50 microns) of chemically thinned cover glass layer 430. Similar to FIG. 2, the pen-drop failure height data points are shown as circles and the indentation failure load data points as shown as squares in FIG. 3.

As shown in FIG. 3, a cover glass layer formed using a chemical thinning process preforms worse in both the Pen Drop Test and the Puncture Test compared to a redrawn glass layer having the same thickness and made of the same material. For example, the pen drop heights and indentation loads of the 50 micron chemically thinned samples in FIG. 3 (less than 2.5 cm, and less than 1.5 kgf respectively) are lower than the pen drop heights and indentation loads of the 50 micron redrawn samples in FIGS. 2 and 3 (greater than 8 cm, and greater than 2.25 kgf respectively). It is believed that the etching process used to produce a chemically thinned cover glass layer introduces surface flaws on the chemically thinned surface(s) of the cover glass layer. Because of this, a chemically thinned glass layer is believed to be generally less reliable than a corresponding redrawn cover glass layer having the same thickness.

Figure 5:
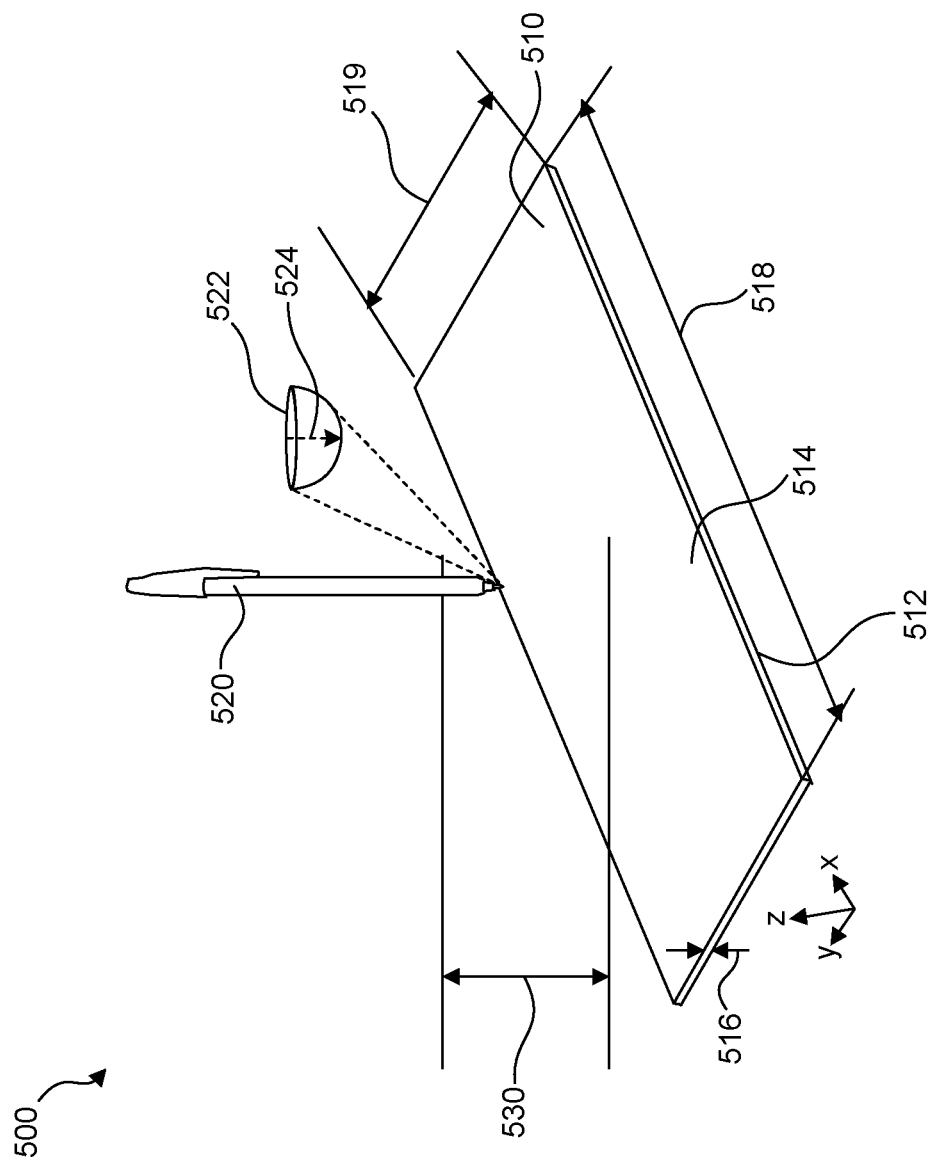
FIG. 5 illustrates a finite element model to simulate pen drop tests according to some embodiments.

Finite element analysis was used to evaluate why redrawn cover glass layers having a thickness less than 50 microns unexpectedly performed better in both the Pen Drop Test and the Puncture Test than did the chemically thinned cover glass layers. By modeling the stresses imparted by a Pen Drop Test, the degree of stresses imparted on a cover glass layer by a puncture force can be analyzed to evaluate the failure mode of the cover glass layer. FIG. 5 illustrates a finite element model 500 used to analyze these stresses.

Cover glass layer 510 in model 500 represents a cover glass layer 430 of a test sample 400. A top surface 514 of modeled cover glass layer 510 is the surface loaded with puncture force and a bottom surface 512 of modeled cover glass layer 510 is the surface bonded to a substrate with a 50 micron thick optically clear adhesive layer. In model 500,

TABLE 1

Glass Compositions

| Oxide (mol %) | Composition 1 | Composition 2 | Composition 3 | Composition 4 | Composition 5 |
|---|---|---|---|---|---|
| $SiO_2$ | 68.95 | 67.53 | 64.68 | 57.43 | 63.67 |
| $B_2O_3$ | | 3.86 | 5.11 | | |
| $Al_2O_3$ | 10.27 | 12.68 | 13.92 | 16.10 | 15.64 |
| $P_2O_5$ | | | | 6.54 | 2.47 |
| $Na_2O$ | 15.20 | 13.67 | 13.80 | 17.05 | 10.82 |
| $K_2O$ | | 0.01 | 0.01 | | |
| MgO | 5.36 | 2.33 | 2.35 | 2.81 | |
| CaO | 0.06 | | 0.03 | | |
| $Fe_2O_3$ | | 0.01 | 0.01 | | |
| ZnO | | | | | 1.16 |
| $Li_2O$ | | | | | 6.19 |
| $SnO_2$ | 0.17 | 0.10 | 0.08 | 0.07 | 0.04 |
| Total | 100.00 | 100.00 | 100.00 | 100.00 | 100.00 |
| $R_2O + RO$ | 20.61 | 16.01 | 16.20 | 19.86 | 18.17 |
| $R_2O - Al_2O_3$ | 4.93 | 1.01 | −0.11 | 0.95 | 1.37 |

Further, while the test results reported in FIGS. 2 and 3 are test results for samples 400 having a 50 micron thick optically transparent adhesive layer, thinner optically transparent adhesive layers 420, for example 25 microns and 10 microns, will result in the same performance for the cover glass layers. However, a significant amount of adhesive allows local deformation of the cover glass layer at puncture force locations. In some embodiments the relatively elastic optically transparent adhesive layer allows a cover glass layer to locally deform at puncture force locations, and therefore absorb some of the puncture forces. A minimum adhesive layer thickness of 5 microns allows sufficient localized deformation of a cover glass layer.

FIG. 2 shows a graph 200 of the pen-drop failure height and indentation failure load values for five different thicknesses of redrawn cover glass layers 430 (25 microns, 35 microns, 50 microns, 75 microns, and 100 microns). Each point on graph 200 represents the average values of 15-20 data points for each thickness of test sample 400. The pen-drop height data points are shown as circles and the indentation failure load data points as shown as squares.

The pen-drop height and indentation failure load results show that both pen drop failure heights and indentation failure loads monotonically decrease for a cover glass layer 430 having thicknesses that decrease from 100 microns to 50 microns. Then, unexpectedly, when the thickness of cover glass layer 430 further is decreased to less than 50 microns, the trend for both pen drop failure height and indentation failure load, reverses. The pen drop failure height and indention failure load values for the 35 micron test samples and the 25 micron test samples are higher than the values for the 50 micron test samples. This behavior shows that a cover glass layer's reliability (e.g., puncture and fracture resistance) can be increased relative to a 50 micron thick layer by reducing the cover glass layer's thickness below 50 microns. This reduction in thickness not only improves the cover glass layer's reliability, but also increases the relative flexibility (bendability) of a cover glass layer because of the reduction in thickness. A thinner cover glass layer tends to the X-direction corresponds with the top surface 514 along the length 518 of modeled cover glass layer 510, the Y-direction corresponds with the top surface 514 along the width 519 of modeled cover glass layer 510, and the Z-direction corresponds with the thickness 516 of modeled cover glass layer 510 from bottom surface 512 to top surface 514. Pen drop height 530 is measured in the Z direction. For the model 500, a pen 520 was modeled to impart a puncture load on top surface 514 of modeled cover glass layer 510. Pen 520 was modeled to replicate a BIC® Easy Glide Pen, Fine, having a tungsten carbide ball point tip 522 of 0.7 mm (0.68 mm) diameter (radius 524 of 0.34 mm), and a weight of 5.73 grams (which includes the weight of a BIC® Easy Glide Pen's cap).

Figure 6:
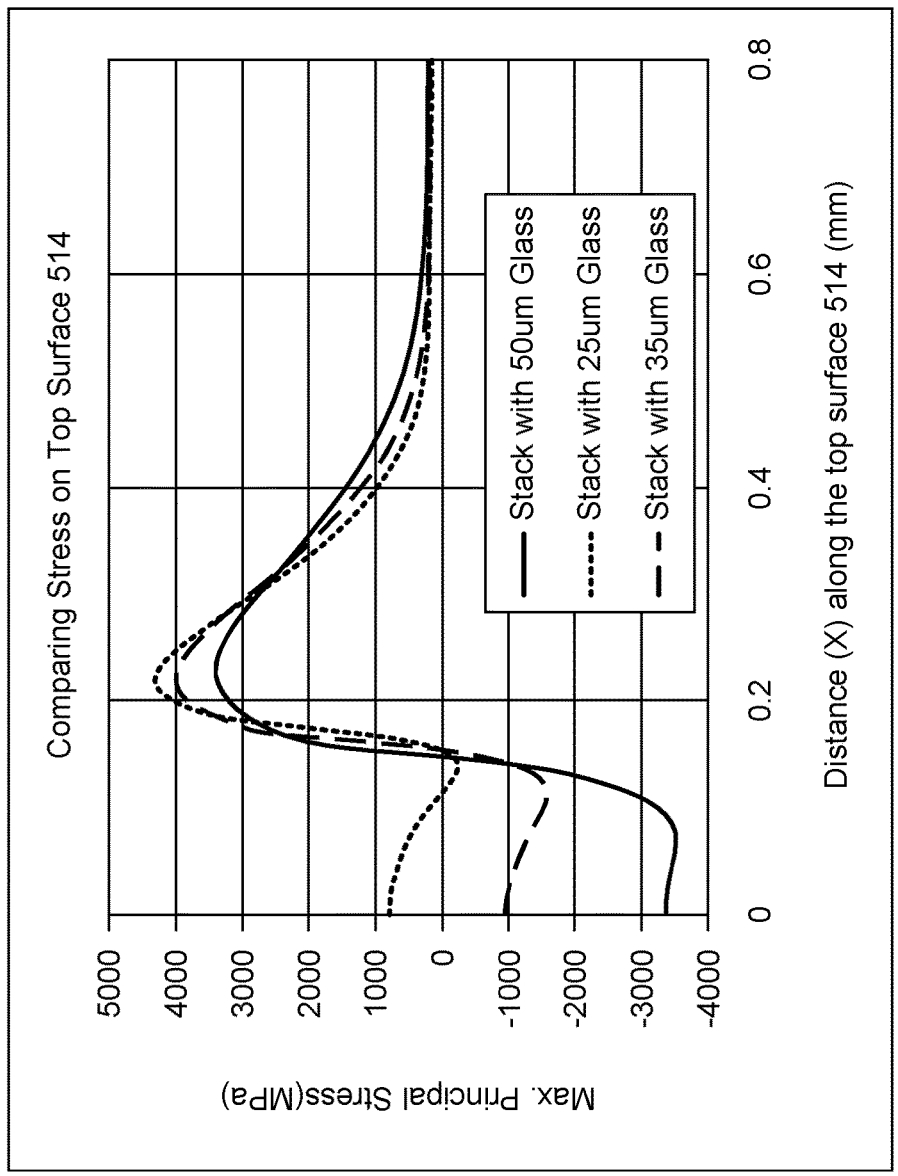
FIG. 6 is a graph of maximum principal stress on the top surface of a cover glass layer for modeled laminates as function of distance on the top surface of the cover glass layer.
Figure 7:
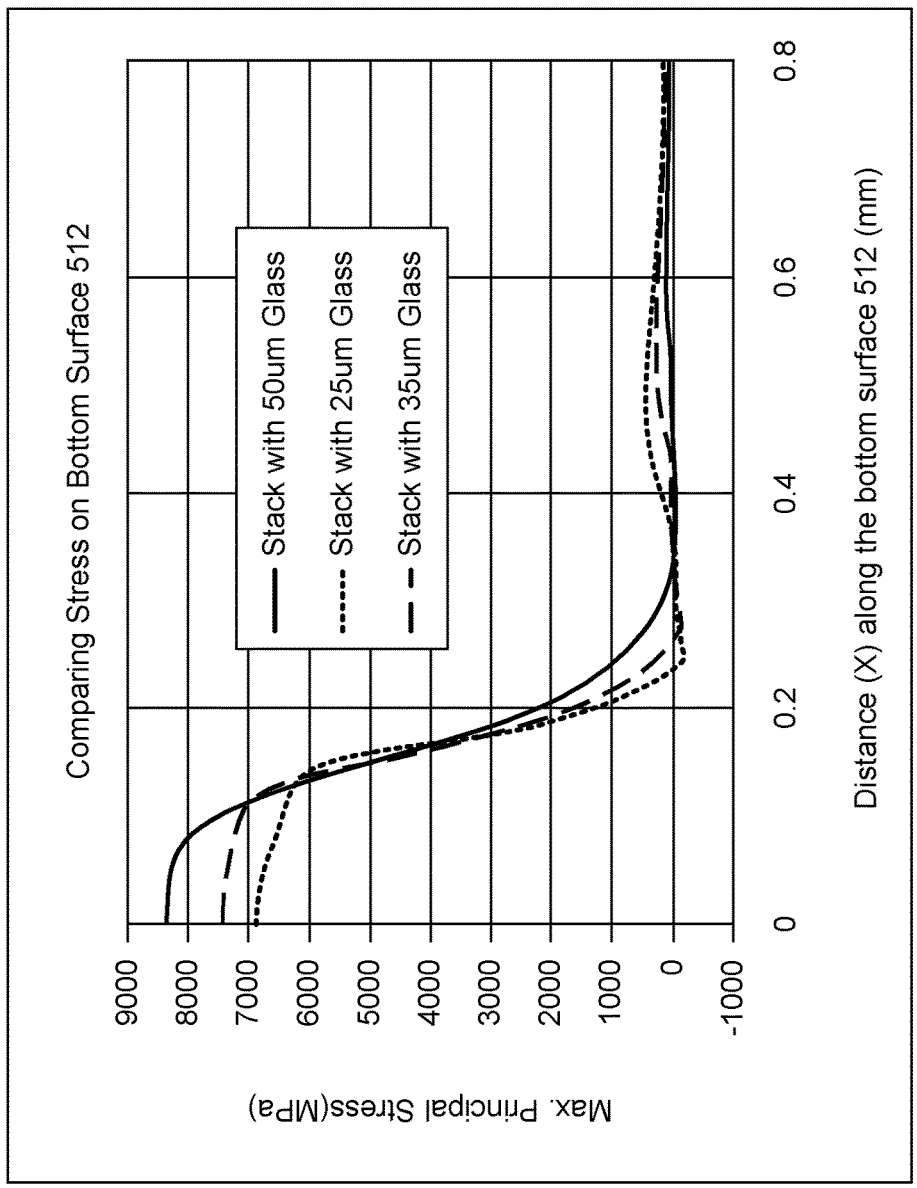
FIG. 7 is a graph of maximum principal stress on the bottom surface of a cover glass layer for modeled laminates as a function of distance on the bottom surface of the cover glass layer.

FIG. 6 shows a graph 600 of the maximum principal stress distribution imparted on top surface 514 in the X-direction of model 500 for different cover glass layer 510 thicknesses and for a pen drop height 530 of 10 centimeters (cm). FIG. 7 shows a graph 700 of the maximum principal stress distribution imparted on bottom surface 512 in the X-direction of model 500 for different cover glass layer 510 thicknesses and for a pen drop height 530 of 10 centimeters (cm). Both graphs 600 and 700 show modeled cover glass layer 510 thicknesses of 50 microns, 35 microns, and 25 microns. In graph 600, an X-direction value of zero is the point on the top surface 514 where the center of modeled ball point tip 522 contacts the top surface 514. In graph 700, an X-direction value of zero is the point on the bottom surface 512 directly below the point on top surface 514 in the Z-direction where the center of modeled ball point tip 522 contacts the top surface 514.

As shown in FIG. 6, the finite element analysis shows that the values for maximum principal stress on top surface 514 for all three thicknesses follow a similar trend. Similarly, as shown in FIG. 7, the finite element analysis shows that the values for maximum principal stress on bottom surface 512 for all three thicknesses follow a similar trend.

By comparing FIGS. 6 and 7 it can be seen that the largest difference between the maximum principal stress on the top surface 514 and the maximum principal stress on bottom surface 512 ("delta maximum stress") is located at an X value of zero (i.e., the point on the top surface 514 where the center of modeled ball point tip 522 contacts the top surface 514). FIGS. 6 and 7 show that the glass layer 510 experiences the highest stress at this location, X value of zero. Thus, comparatively, the 25 micron thick glass layer 510 has the smallest delta maximum stress at an X value of zero, which shows that the modeled cover glass layer 510 having a thickness of 25 microns experiences the lowest amount of stresses (among these thicknesses) during a puncture event. The modeled cover glass layer 510 having a thickness of 35 microns has a delta maximum stress that is more than the 25 micron thick layer, but still less than the 50 micron thick layer. For the 25 micron thick glass layer 510, maximum principal stress on bottom surface 512 at X equal zero is less than that of the other glass thicknesses (35 micron and 50 micron). The maximum principal stress on top surface 514 of the 25 micron thick glass layer 510 at X equal to zero is higher than that of the other glass thicknesses. However, the maximum principal stress at bottom surface 512 of the glass layers at X equal to zero is much higher (about 2 or more times higher) than that on the top surface, hence this maximum principal stress will most likely determine whether a glass layer fails during a puncture event.

The results shown in FIGS. 6 and 7 indicate that lower stress values are present through the thickness of the 25 micron and 35 micron thick cover glass layers 510 than those of the 50 micron thick cover glass layer 510. These lower stress values present through the thickness of the thinner cover glass layers 510 result in the improved Pen Drop Test and Puncture Test results as shown in FIG. 2. In other words, compared to a 50 micron thick glass layer, similar drop energies create relatively less stress through the thickness of a cover glass layer that has a thickness less than 50 microns. This means that these thinner layers are better able to survive a given puncture force compared to a 50 micron thick cover glass layer. As shown in FIGS. 6 and 7, reducing the cover glass layer thickness from 50 microns to 25 microns results in lower tensile stress on bottom surface 512 and higher stress on top surface 514. It is believed this behavior is indicative of a shift in the glass failure mode as glass thickness is reduced, and a result of this shift is improved puncture and fracture resistance.

Further, by comparing FIGS. 6 and 7, it can be seen that the maximum values of principal stresses present on the bottom surface 512 of a cover glass layer 510 are significantly higher in magnitude than those on top surface 514. This is particularly true for X values less than about 0.15 mm, where maximum values on bottom surface 512 are above 5000 MPa (megaPascal). Since model 500 showed that the tensile principal stresses on bottom surface 512 are the highest principal stresses; these stresses are most likely to contribute to failure during a Pen Drop Test and/or a Puncture Test. Accordingly, a cover glass layer that results in lower maximum principal stress on bottom surface 512 is more likely to have improved performance in a Pen Drop and/or Puncture Test.

Figure 8:
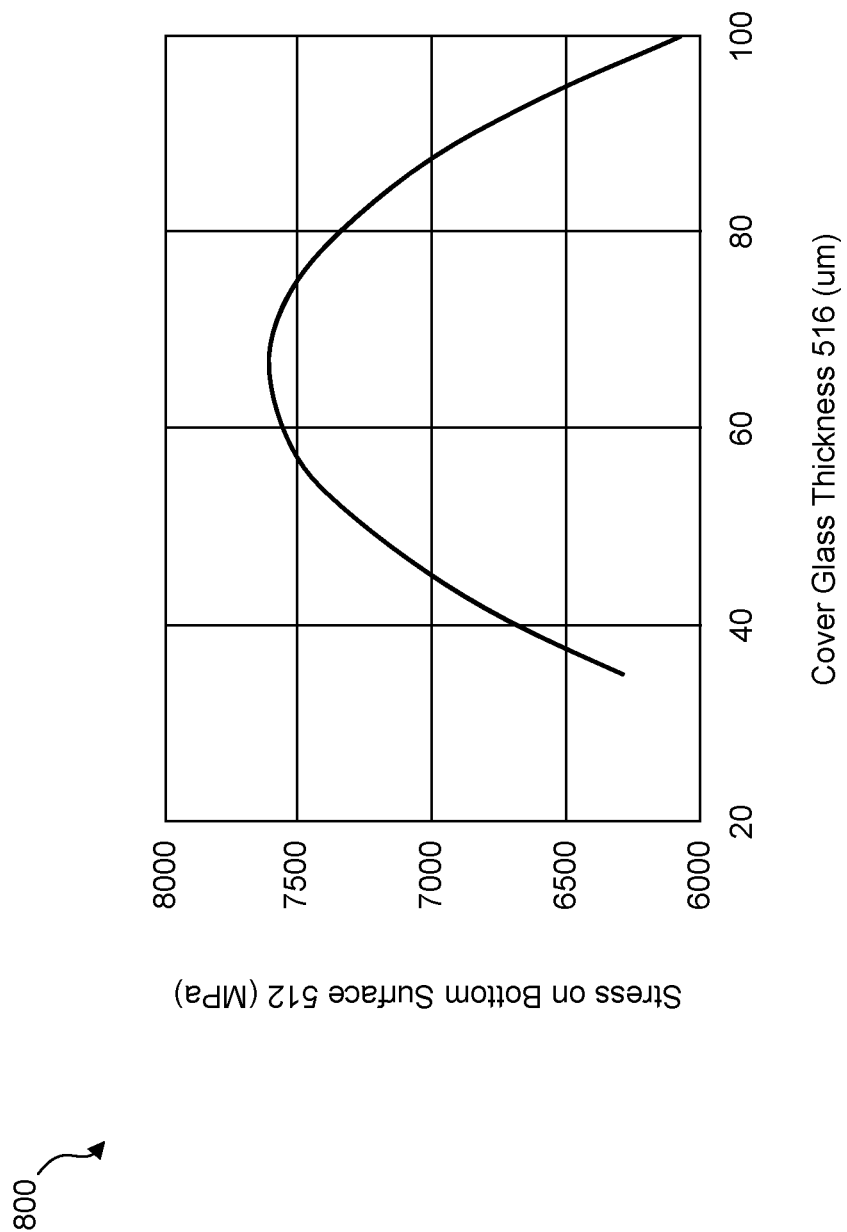
FIG. 8 is a graph of maximum stress on the bottom surface of a cover glass layer for modeled laminates as a function of cover glass layer thickness.

FIG. 8 shows a graph 800 of the maximum principal stress on bottom surface 512 for modeled cover glass layer 510 as a function of thickness 516 based on a pen drop height of 2 centimeters (cm). As shown in FIG. 8, the maximum amount of principal stress on bottom surface 512 occurs in a cover glass layer 510 having a thickness 516 of about 65 microns. In agreement with the results shown in FIGS. 6 and 7, reducing a cover glass layer's thickness below 50 microns results in a lower value for the maximum principal stress on bottom surface 512. And similar to the results of FIGS. 6 and 7, this behavior is unexpected.

So, as shown in the test results of FIGS. 2 and 3 and the finite element model analysis results in FIGS. 6-8, cover glass layers having a thickness less than 50 microns (e.g., 49 microns or less) included in laminates described herein have superior and unexpected puncture and fracture resistance compared to a cover glass layer having a thickness of 50 microns included in similar laminates. This behavior is unexpected because, generally, as glass thickness decreases, puncture and fracture resistance to impact forces (e.g., pen drop forces) is expected to decrease. This trend of decreasing puncture and fracture resistance is shown in the test results for the 100 micron thick, 75 micron thick, and 50 micron thick test samples 400 in FIGS. 2 and 3. However, for a thickness less than 50 microns, this trend unexpectedly reverses. The test results for the 35 micron and 25 micron thick test samples 400 show that by reducing a cover glass layer's thickness to less than 50 microns, puncture and fracture resistance to impact forces (e.g., pen drop forces) can be increased relative to a comparable 50 micron thick cover glass layer.

The unexpected and superior behavior of cover glass layers having a thickness of less than 50 microns was confirmed by finite element analysis, which shows that impact forces (e.g., pen drop forces) create smaller amounts of stress in such cover glass layers. Since these stress values are smaller, such cover glass layers (having thicknesses less than 50 microns) can better resist puncture and/or fracture due to impact forces. In particular, smaller stress values on the bottom surface of cover glass layers having a thickness of less than 50 microns result in cover glass layers better suited to resist puncture and/or fracture due to impact forces.

Figure 10:
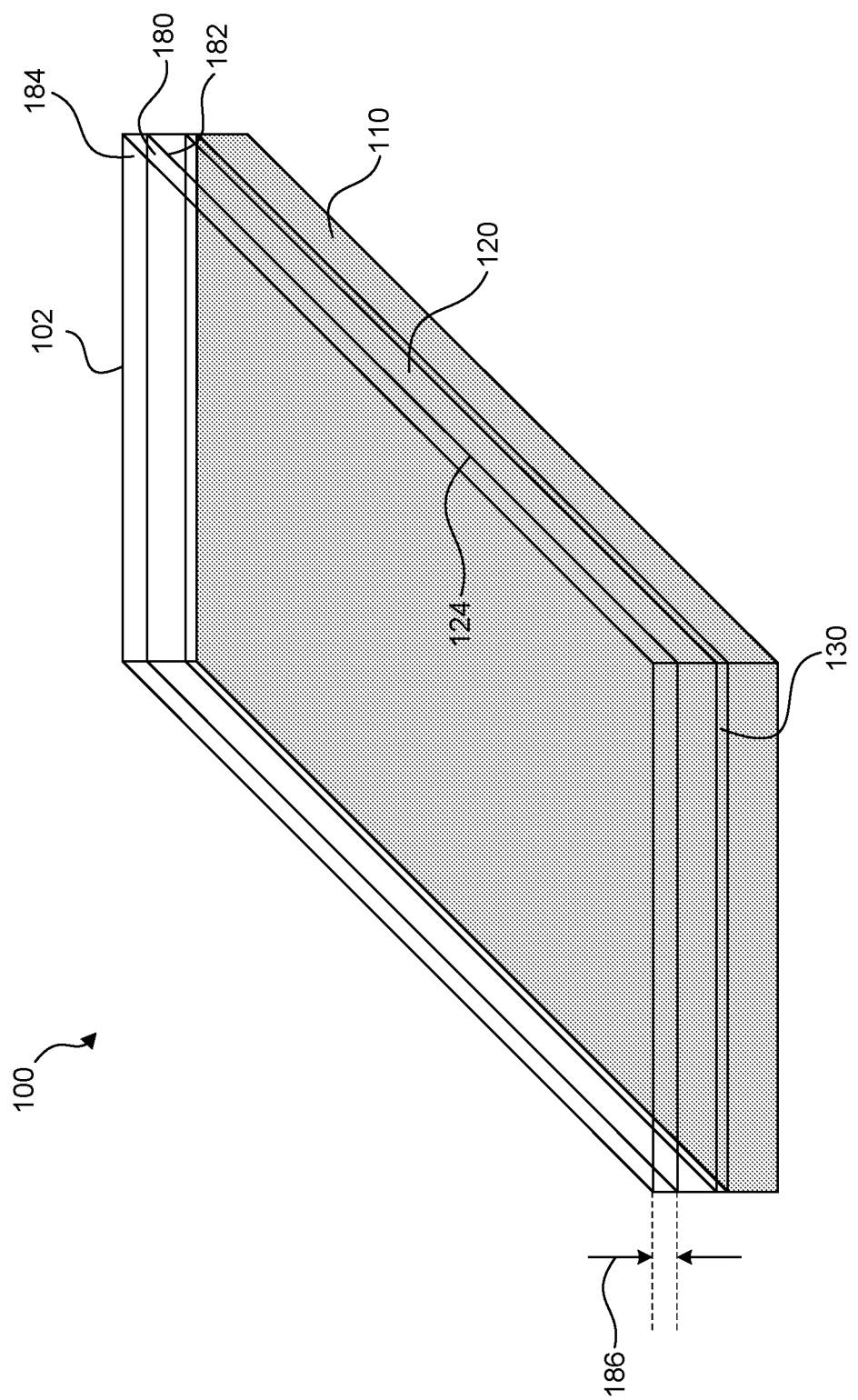
FIG. 10 illustrates an article including a coating layer according to some embodiments.

In some embodiments, for example as shown in FIG. 10, laminate 102 may be coated with a coating layer 180 having a bottom surface 182, a top surface 184, and a thickness 186. In some embodiments, a coating layer 180 may be bonded to top surface 124 of cover glass layer 120. In some embodiments, a coating layer 180 may be disposed on top surface 124 of cover glass layer 120. In some embodiments, multiple coating layers 180, of the same or different materials and/or thicknesses, may be coated over cover glass layer 120 including on top surface, and/or on bottom surface 112.

In some embodiments, a coating layer 180 may be an optically transparent polymeric (OTP) hard-coat layer. Suitable materials for an OTP hard-coat layer include, but are not limited to, a polyimide, a polyethylene terephthalate (PET), a polycarbonate (PC), a poly methyl methacrylate (PMMA), organic polymer materials, inorganic-organic hybrid polymeric materials, and aliphatic or aromatic hexafunctional urethane acrylates. In some embodiments, an OTP hard-coat layer may consist essentially of an organic polymer material, an inorganic-organic hybrid polymeric material, or aliphatic or aromatic hexafunctional urethane acrylate. In some embodiments, an OTP hard-coat layer may consist of a polyimide, an organic polymer material, an inorganic-organic hybrid polymeric material, or aliphatic or aromatic hexafunctional urethane acrylate.

As used herein, "organic polymer material" means a polymeric material comprising monomers with only organic components. In some embodiments, an OTP hard-coat layer may comprise an organic polymer material manufactured by Gunze Limited and having a hardness of 9H, for example Gunze's "Highly Durable Transparent Film." As used herein, "inorganic-organic hybrid polymeric material" means a polymeric material comprising monomers with inorganic and organic components. An inorganic-organic hybrid polymer is obtained by a polymerization reaction between monomers having an inorganic group and an organic group. An inorganic-organic hybrid polymer is not a nanocomposite material comprising separate inorganic and organic constituents or phases, for example inorganic particulate dispersed within an organic matrix.

In some embodiments, the inorganic-organic hybrid polymeric material may include polymerized monomers comprising an inorganic silicon-based group, for example, a silsesquioxane polymer. A silsesquioxane polymer may be, for example, an alky-silsesquioxane, an aryl-silsesquioxane, or an aryl alkyl-silsesquioxane having the following chemical structure: $(RSiO_{1.5})n$, where R is an organic group for example, but not limited to, methyl or phenyl. In some embodiments, an OTP hard-coat layer may comprise a silsesquioxane polymer combined with an organic matrix, for example, SILPLUS manufactured by Nippon Steel Chemical Co., Ltd.

In some embodiments, an OTP hard-coat layer may comprise 90 wt % to 95 wt % aromatic hexafunctional urethane acrylate (e.g., PU662NT (Aromatic hexafunctional urethane acrylate) manufactured by Miwon Specialty Chemical Co.) and 10 wt % to 5 wt % photo-initiator (e.g., Darocur 1173 manufactured by Ciba Specialty Chemicals Corporation) with a hardness of 8H or more. In some embodiments, an OTP hard-coat layer comprising an aliphatic or aromatic hexafunctional urethane acrylate may be formed as a stand-alone layer by spin-coating the layer on a polyethylene terephthalate (PET) substrate, curing the urethane acrylate, and removing the urethane acrylate layer from the PET substrate.

An OTP hard-coat layer may have a thickness 186 in the range of 10 microns to 120 microns, including subranges. For example, an OTP hard-coat layer may have a thickness 186 of 10 microns, 20 microns, 30 microns, 40 microns, 50 microns, 60 microns, 70 microns, 80 microns, 90 microns, 100 microns, 110 microns, 120 microns, or within a range having any two of these values as endpoints. In some embodiments, an OTP hard-coat layer may be a single monolithic layer.

In some embodiments, an OTP hard-coat layer may be an inorganic-organic hybrid polymeric material layer or an organic polymer material layer having a thickness in the range of 80 microns to 120 microns, including subranges. For example, an OTP hard-coat layer comprising an inorganic-organic hybrid polymeric material or an organic polymer material may have a thickness of 80 microns, 90 microns, 100 microns, 110 microns, 120 microns, or within a range having any two of these values as end points. In some embodiments, an OTP hard-coat layer may be an aliphatic or aromatic hexafunctional urethane acrylate material layer having a thickness in the range of 10 microns to 60 microns, including subranges for example of 15 microns to 60 microns, or of 20 microns to 60 microns, or of 25 microns to 60 microns, or of 30 microns to 60 microns, or of 45 microns to 60 microns, or of 50 microns to 60 microns, or of 10 microns to 55 microns, or of 10 microns to 50 microns, or of 10 microns to 45 microns, or of 10 microns to 40 microns, or of 10 microns to 35 microns, or of 10 microns to 30 microns, or of 10 microns to 25 microns, or of 10 microns to 20 microns. For example, an OTP hard-coat layer comprising an aliphatic or aromatic hexafunctional urethane acrylate material may have a thickness of 10 microns, 20 microns, 30 microns, 40 microns, 50 microns, 60 microns, or within a range having any two of these values as end points.

In some embodiments, coating layer(s) 180 may be an anti-reflection coating layer. Exemplary materials suitable for use in the anti-reflection coating layer include: $SiO_2$, $Al_2O_3$, $GeO_2$, $SiO$, $AlO_xN_y$, $AlN$, $SiN$, $SiO_xN_y$, $SiAlO_xN_y$, $Ta_2O_5$, $Nb_2O_5$, $TiO_2$, $ZrO_2$, $TiN$, $MgO$, $MgF_2$, $BaF_2$, $CaF_2$, $SnO_2$, $HfO_2$, $Y_2O_3$, $MoO_3$, $DyF_3$, $YbF_3$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, and other materials cited above as suitable for use in a scratch resistant layer. An anti-reflection coating layer may include sub-layers of different materials.

In some embodiments, the anti-reflection coating layer may include a hexagonally packed nanoparticle layer, for example but not limited to, the hexagonally packed nanoparticle layers described in U.S. Pat. No. 9,272,947, issued Mar. 1, 2016, which is hereby incorporated by reference in its entirety. In some embodiments, the anti-reflection coating layer may include a nanoporous Si-containing coating layer, for example but not limited to the nanoporous Si-containing coating layers described in WO2013/106629, published on Jul. 18, 2013, which is hereby incorporated by reference in its entirety. In some embodiments, the anti-reflection coating may include a multilayer coating, for example, but not limited to the multilayer coatings described in WO2013/106638, published on Jul. 18, 2013; WO2013/082488, published on Jun. 6, 2013; and U.S. Pat. No. 9,335,444, issued on May 10, 2016, all of which are hereby incorporated by reference in their entirety.

In some embodiments, coating layer(s) 180 may be an easy-to-clean coating layer. In some embodiments, the easy-to-clean coating layer may include a material selected from the group consisting of fluoroalkylsilanes, perfluoropolyether alkoxy silanes, perfluoroalkyl alkoxy silanes, fluoroalkylsilane-(non-fluoroalkylsilane) copolymers, and mixtures of fluoroalkylsilanes. In some embodiments, the easy-to-clean coating layer may include one or more materials that are silanes of selected types containing perfluorinated groups, for example, perfluoroalkyl silanes of formula (RF)$_y$Si$_{X4-y}$, where RF is a linear C6-C$_{30}$ perfluoroalkyl group, X=Cl, acetoxy, —OCH$_3$, and —OCH$_2$CH$_3$, and y=2 or 3. The perfluoroalkyl silanes can be obtained commercially from many vendors including Dow-Corning (for example fluorocarbons 2604 and 2634), 3M Company (for example ECC-1000 and ECC-4000), and other fluorocarbon suppliers for example Daikin Corporation, Ceko (South Korea), Cotec-GmbH (DURALON UltraTec materials) and Evonik. In some embodiments, the easy-to-clean coating layer may include an easy-to-clean coating layer as described in WO2013/082477, published on Jun. 6, 2013, which is hereby incorporated by reference in its entirety.

In some embodiments, coating layer(s) 180 may be an anti-glare layer formed on or disposed over top surface 124 of cover glass layer 120. Suitable anti-glare layers include, but are not limited to, the anti-glare layers prepared by the processes described in U.S. Pat. Pub. Nos. 2010/0246016, 2011/0062849, 2011/0267697, 2011/0267698, 2015/0198752, and 2012/0281292, all of which are hereby incorporated by reference in their entirety.

In some embodiments, coating layer(s) 180 may be an anti-fingerprint coating layer. Suitable anti-fingerprint coating layers include, but are not limited to, oleophobic surface layers including gas-trapping features, as described in, for example, U.S. Pat. App. Pub. No. 2011/0206903, published Aug. 25, 2011, and oleophilic coatings formed from an uncured or partially-cured siloxane coating precursor comprising an inorganic side chain that is reactive with the surface of the glass or glass-ceramic substrate (e.g., partially-cured linear alkyl siloxane), as described in, for example, U.S. Pat. App. Pub. No. 2013/0130004, published May 23, 2013. The contents of U.S. Pat. App. Pub. No. 2011/0206903 and U.S. Pat. App. Pub. No. 2013/0130004 are incorporated herein by reference in their entirety.

In some embodiments, coating layer(s) 180 may be an anti-microbial and/or anti-viral layer formed on or disposed over top surface 124 of cover glass layer 120. Suitable anti-microbial and/or anti-viral layers include, but are not limited to, an antimicrobial Ag+ region extending from the surface of the glass to a depth in the glass having a suitable concentration of Ag+1 ions on the surface of the glass, as described in, for example, U.S. Pat. App. Pub. No. 2012/0034435, published Feb. 9, 2012, and U.S. Pat. App. Pub. No. 2015/0118276, published Apr. 30, 2015. The contents of U.S. Pat. App. Pub. No. 2012/0034435 and U.S. Pat. App. Pub. No. 2015/0118276 are incorporated herein by reference in their entirety.

In some embodiments, cover glass layer 120 may be a 2D, 2.5D, or 3D cover glass. As used herein, "2D cover glass" includes a cover glass having a perimeter edge with a chamfered shape on the top and/or bottom surfaces of the cover glass adjacent to the perimeter edge. The chamfered shape on the top and/or bottom surfaces may be formed by, for example, a finishing method including mechanical grinding. A 2D cover glass may have a chamfered shape on the top and bottom surfaces of the cover glass that is the same or different.

As used herein, "2.5D cover glass" means a cover glass having a perimeter edge with a curved surface on its top (user-facing) side. The curved surface may be formed by, for example, a mechanical polishing method. The curved surface on the top side of a 2.5D cover glass is smoother to the touch than a chamfered surface of a 2D cover glass. As used herein, "3D cover glass" means a cover glass having a bent perimeter edge that forms a non-planar shape. The bent perimeter edge may be formed by, for example, thermal forming and/or cold-forming. A 3D cover glass has a curved bottom surface and a curved top surface adjacent to the perimeter edge of the cover glass. A 3D cover glass refers to a cover glass that holds a 3D shape as described herein at room temperature (23° C.) and when not being subject to an external force (e.g., a bending force). A flexible film that may deform under its own weight at room temperature is not considered a 3D cover glass as described herein. Both 2.5D and 3D cover glasses have a topmost exterior surface that includes a substantially flat central area and a curved peripheral area disposed around all or portion of the substantially flat central area. A 3D cover glass includes a bottommost exterior surface that includes a substantially flat central area and a curved peripheral area disposed around all or portion of the substantially flat central area.

FIG. 11A shows a 2D cover glass 1100 according to some embodiments. Cover glass 1100 includes a substantially flat central area 1102 and a chamfered peripheral area 1104. Peripheral area 1104 of 2D cover glass 1100 may be finished by a mechanical grinding method to create a chamfered shape on the top surface 1106 and/or bottom surface 1108 of cover glass 1100. In some embodiments, the chamfered shape on top surface 1106 and bottom surface 1108 of cover glass 1100 may be the same.

FIG. 11B shows a 2.5D cover glass 1110 according to some embodiments. 2.5D cover glass 1110 includes a substantially flat central area 1112 and a curved peripheral area 1114 on a top surface 1116 of cover glass 1110. Curved peripheral area 1114 may be finished with a mechanical polishing method to form a curved surface on top surface 1116. As such, 2.5D cover glass 1110 may have a peripheral area 1114 having a flat bottom surface 1118 and a curved top surface 1116. In some embodiments, a 2.5D cover glass may be made by mechanically polishing a peripheral area of a glass layer.

FIG. 11C shows a 3D cover glass 1120 according to some embodiments. 3D cover glass 1120 includes a substantially flat central area 1122 and a curved peripheral area 1124. 3D cover glass 1120 has a curved top surface 1126 and a curved bottom surface 1128 in curved peripheral area 1124. 3D cover glass 1120 may be formed by, for example, molding a glass layer into a 3D shape.

Figure 12:
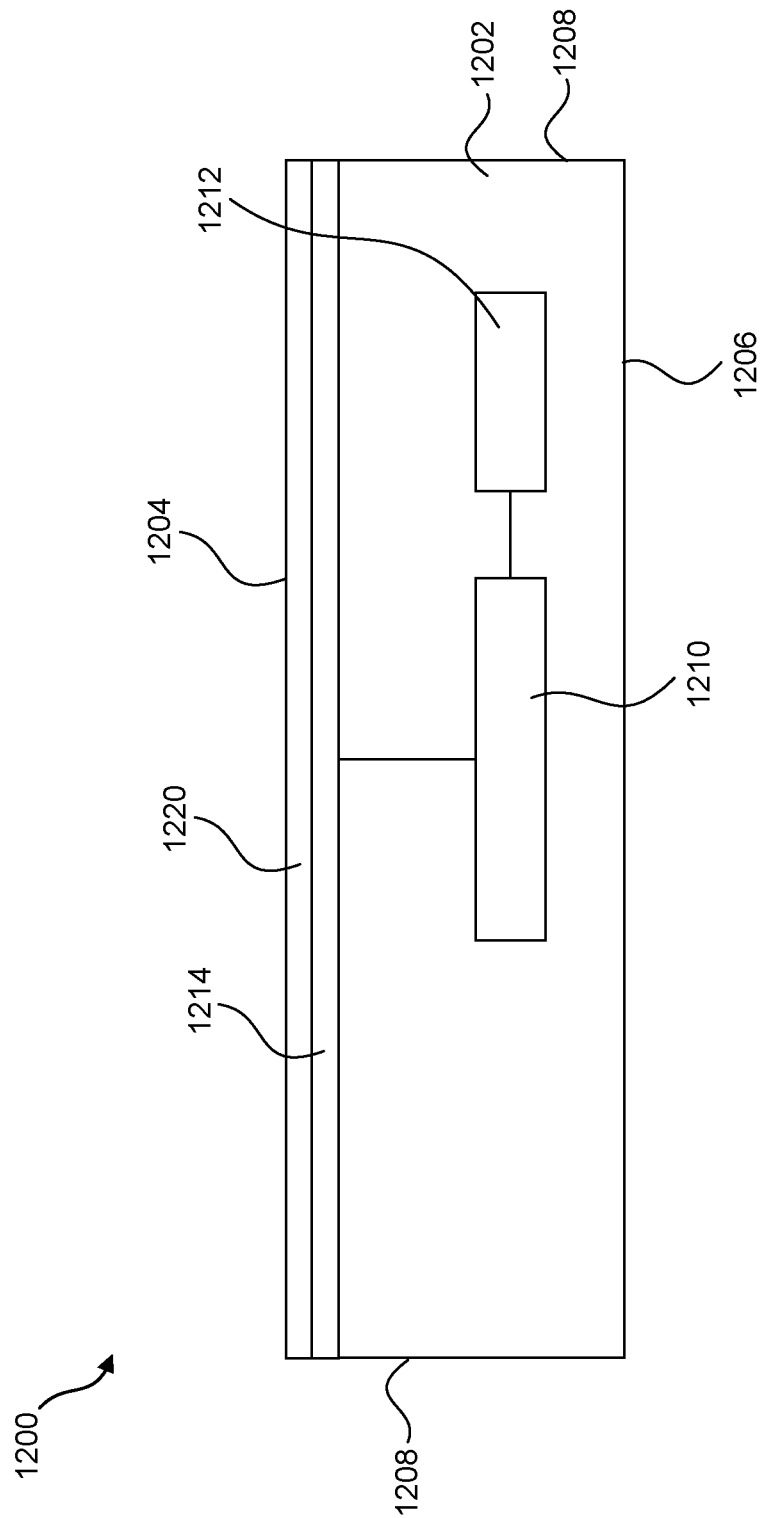
FIG. 12 illustrates a consumer product according to some embodiments.

FIG. 12 shows a consumer electronic product 1200 according to some embodiments. Consumer electronic product 1200 may include a housing 1202 having a front (user-facing) surface 1204, a back surface 1206 opposite front surface 1204, and side surfaces 1208. Electrical components may be provided at least partially within housing 1202. The electrical components may include, among others, a controller 1210, a memory 1212, and display components, including a display 1214. In some embodiments, display 1214 may be provided at or adjacent to front surface 1204 of housing 1202. Display 1214 may be, for example, a light emitting diode (LED) display or an organic light emitting diode (OLED) display.

As shown for example in FIG. 12, consumer electronic product 1200 may include a cover substrate 1220. Cover substrate 1220 may serve to protect display 1214 and other components of electronic product 1200 (e.g., controller 1210 and memory 1212) from damage. In some embodiments, cover substrate 1220 may be disposed over display 1214. In some embodiments, cover substrate 1220 may be bonded to display 1214. In some embodiments, cover substrate 1220 may be a cover glass defined in whole or in part by a cover glass layer 120 discussed herein. Cover substrate 1220 may be a 2D, 2.5D, or 3D cover substrate. Cover substrate 1220 may define at least a portion of housing 1202. In some embodiments, cover substrate 1220 may define front surface 1204 of housing 1202. In some embodiments, cover substrate 1220 may define front surface 1204 of housing 1202 and all or a portion of side surfaces 1208 of housing 1202. In some embodiments, consumer electronic product 1200 may include a cover substrate 1220 defining all or a portion of back surface 1206 of housing 1202.

In some embodiments, a cover glass layer discussed herein may comprise a "glass-ceramic" material produced through controlled crystallization of glass. In such embodiments, glass-ceramics have about 30% to about 90% crystallinity. Non-limiting examples of glass-ceramic systems that may be used include $Li_2O \times Al_2O_3 \times nSiO_2$ (i.e. LAS system), $MgO \times Al_2O_3 \times nSiO_2$ (i.e. MAS system), and $ZnO \times Al_2O_3 \times nSiO_2$ (i.e. ZAS system). In one or more alternative embodiments, the glass layer may include crystalline substrates for example glass-ceramic substrates (which may be strengthened or non-strengthened) or may include a single crystal structure, for example sapphire. In one or more specific embodiments, the glass layer may include an amorphous base (e.g., glass) and a crystalline cladding (e.g., sapphire layer, a polycrystalline alumina layer and/or a spinel ($MgAl_2O_4$) layer). In some embodiments, a cover glass layer discussed herein may be not be comprised of a glass-ceramic material.

As discussed herein, a cover glass layer be strengthened to form a strengthened layer. As used herein, the terms "strengthened layer" may refer to a layer that has been chemically strengthened, for example through ion-exchange of larger ions for smaller ions in the surface of the layer. Other strengthening methods known in the art, for example thermal tempering, or utilizing a mismatch of the coefficient of thermal expansion between portions of the layer to create compressive stress and central tension regions, may also be utilized to form strengthened layers.

Where the layer is chemically strengthened by an ion exchange process, the ions in the surface layer of the layer are replaced by—or exchanged with—larger ions having the same valence or oxidation state. Ion exchange processes are typically carried out by immersing a layer in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the layer in a salt bath (or baths), use of multiple salt baths, additional steps for example annealing, washing, and the like, are generally determined by the composition of the layer and the desired compressive stress (CS), depth of compressive stress layer (or depth of layer) of the substrate that result from the strengthening operation. By way of example, ion exchange of alkali metal-containing glass layers may be achieved by immersion in at least one molten bath containing a salt for example, but not limited to, nitrates, sulfates, and chlorides of the larger alkali metal ion.

The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which glass layers are immersed in multiple ion exchange baths, with washing and/or annealing steps between immersions, are described in U.S. patent application Ser. No. 12/500,650, filed Jul. 10, 2009, by Douglas C. Allan et al., entitled "Glass with Compressive Surface for Consumer Applications" and claiming priority from U.S. Provisional Patent Application No. 61/079,995, filed Jul. 11, 2008, in which glass substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass substrates are strengthened by ion exchange in a first bath is diluted with an effluent ion, followed by immersion in a second bath having a smaller concentration of the effluent ion than the first bath. The contents of U.S. patent application Ser. No. 12/500,650 and U.S. Pat. No. 8,312,739 are incorporated herein by reference in their entirety.

While various embodiments have been described herein, they have been presented by way of example, and not limitation. It should be apparent that adaptations and modifications are intended to be within the meaning and range of equivalents of the disclosed embodiments, based on the teaching and guidance presented herein. It therefore will be apparent to one skilled in the art that various changes in form and detail can be made to the embodiments disclosed herein without departing from the spirit and scope of the present disclosure. The elements of the embodiments presented herein are not necessarily mutually exclusive, but may be interchanged to meet various situations as would be appreciated by one of skill in the art.

Embodiments of the present disclosure are described in detail herein with reference to embodiments thereof as illustrated in the accompanying drawings, in which like reference numerals are used to indicate identical or functionally similar elements. References to "one embodiment," "an embodiment," "some embodiments," "in certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The examples are illustrative, but not limiting, of the present disclosure. Other suitable modifications and adaptations of the variety of conditions and parameters normally encountered in the field, and which would be apparent to those skilled in the art, are within the spirit and scope of the disclosure.

The indefinite articles "a" and "an" to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

As used in the claims, "comprising" is an open-ended transitional phrase. A list of elements following the transitional phrase "comprising" is a non-exclusive list, such that elements in addition to those specifically recited in the list may also be present. As used in the claims, "consisting essentially of" or "composed essentially of" limits the composition of a material to the specified materials and those that do not materially affect the basic and novel characteristic(s) of the material. As used in the claims, "consisting of" or "composed entirely of" limits the composition of a material to the specified materials and excludes any material not specified.

The term "wherein" is used as an open-ended transitional phrase, to introduce a recitation of a series of characteristics of the structure.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. Whether or not a numerical value or end-point of a range recites "about," the numerical value or end-point of a range is intended to include two embodiments: one modified by "about," and one not modified by "about."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, for example within about 5% of each other, or within about 2% of each other.

The present embodiment(s) have been described above with the aid of functional building blocks illustrating the specified functions and relationships thereof. The boundaries of these functional building blocks have been arbitrarily defined herein for the convenience of the description. Alternate boundaries can be defined so long as the specified functions and relationships thereof are appropriately performed.

It is to be understood that the phraseology or terminology used herein is for the purpose of description and not of limitation. The breadth and scope of the present disclosure should not be limited by any of the above-described exemplary embodiments, but should be defined in accordance with the following claims and their equivalents.

What is claimed is:

1. An article comprising:
   a laminate comprising:
      a substrate;
      a cover glass layer bonded to a top surface of the substrate, the cover glass layer comprising a thickness in a range of 1 micron to 30 microns; and
      an optically transparent adhesive layer comprising a thickness in a range of 5 microns to 50 microns that bonds a bottom surface of the cover glass layer to the top surface of the substrate,
      wherein the cover glass layer comprises an alkali-containing aluminosilicate glass comprising $SnO_2$ at a mol % of 0.08 mol % or less,
      wherein the laminate achieves a bend radius of 3 mm, and
      wherein the laminate comprises an impact resistance defined by the capability of the cover glass layer to avoid failure at a puncture load of 2.25 kilograms-force or more in a Puncture Test.

2. The article of claim 1, wherein the optically transparent adhesive layer comprises a thickness in the range of 25 microns to 50 microns.

3. The article of claim 1, wherein the cover glass layer is directly bonded to the top surface of the substrate with the optically transparent adhesive layer.

4. The article of claim 1, wherein the laminate comprises an impact resistance defined by the capability of the cover glass layer to avoid failure at a pen drop height of 8 centimeters or more, wherein the pen drop height is measured according to a Pen Drop Test.

5. The article of claim 1, wherein the cover glass layer is a redrawn glass layer drawn to the thickness of the cover glass layer.

6. The article of claim 1, wherein the cover glass layer comprises:
   55 mol % to 70 mol % $SiO_2$;
   10 mol % to 20 mol % $Al_2O_3$; and
   10 mol % to 20 mol % $Na_2O$.

7. The article of claim 1, wherein the cover glass layer comprises a compressive stress at least at one of a top surface or the bottom surface of the cover glass layer, and a concentration of metal oxide that is different at least at two points through the thickness of the cover glass layer.

8. The article of claim 1, wherein the substrate comprises an electronic display comprising a display surface defining at least a portion of the top surface of the substrate.

9. The article of claim 1, comprising a coating layer disposed on a top surface of the cover glass layer.

10. The article of claim 9, wherein the coating layer comprises a coating layer selected from the group consisting of: an anti-reflection coating layer, an anti-glare coating layer, an anti-fingerprint coating layer, an anti-splinter coating layer, and an anti-microbial coating layer.

11. The article of claim 1, wherein the laminate is devoid of a polymeric hard-coating layer disposed on a top surface of the cover glass layer.

12. The article of claim 1, wherein the article is a consumer electronic product and the substrate comprises an electronic display, the consumer electronic product comprising:

a housing comprising a front surface, a back surface and side surfaces; and electrical components positioned at least partially within the housing, the electrical components comprising a controller, a memory, and the electronic display, the electronic display at or adjacent the front surface of the housing, wherein the cover glass layer forms at least a portion of the housing.

13. The article of claim 1, wherein the alkali-containing aluminosilicate glass comprises 0.04 mol % to 0.08 mol % $SnO_2$.

14. A method of making a laminate, the method comprising:

bonding a cover glass layer to a top surface of a substrate, the cover glass layer comprising a thickness in the range of 1 microns to 30 microns, wherein a bottom surface of the cover glass layer is bonded to the top surface of the substrate with an optically transparent adhesive layer comprising a thickness in a range of 5 microns to 50 microns, wherein the cover glass layer comprises an alkali-containing aluminosilicate glass comprising $SnO_2$ at a mol % of 0.08 mol % or less, wherein the laminate achieves a bend radius of 3 mm, and wherein the laminate comprises an impact resistance defined by the capability of the cover glass layer to avoid failure at a puncture load of 2.25 kilograms-force or more in a Puncture Test.

15. The method of claim 14, further comprising forming the cover glass layer with a redrawing process, wherein the redrawing process comprises redrawing the cover glass layer to the thickness of the cover glass layer.

16. The method of claim 14, further comprising coating a top surface of the cover glass layer with a coating layer.

* * * * *